(12) United States Patent
Choi et al.

(10) Patent No.: US 11,159,660 B2
(45) Date of Patent: Oct. 26, 2021

(54) ELECTRONIC DEVICE INCLUDING HOUSING CONTAINING METALLIC MATERIALS

(71) Applicant: Samsung Electronics Co., Ltd., Gyeonggi-do (KR)

(72) Inventors: Byounghee Choi, Gyeonggi-do (KR); Yongwook Hwang, Gyeonggi-do (KR); Changyoun Hwang, Gyeonggi-do (KR); Jinho Lee, Gyeonggi-do (KR); Hyeonwoo Lee, Gyeonggi-do (KR); Youngsoo Jang, Gyeonggi-do (KR); Yunsung Ha, Gyeonggi-do (KR); Junghyeon Hwang, Gyeonggi-do (KR); Minwoo Yoo, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/776,064

(22) Filed: Jan. 29, 2020

(65) Prior Publication Data

US 2020/0252492 A1 Aug. 6, 2020

(30) Foreign Application Priority Data

Jan. 31, 2019 (KR) .................. 10-2019-0012392

(51) Int. Cl.
*H04M 1/02* (2006.01)
*G06F 1/16* (2006.01)
(Continued)

(52) U.S. Cl.
CPC ........ *H04M 1/0249* (2013.01); *G06F 1/1626* (2013.01); *G06F 1/1656* (2013.01);
(Continued)

(58) Field of Classification Search
CPC .... H04M 1/0249; H04M 1/02; H04M 1/0264; H04M 1/0266; H04M 2250/12;
(Continued)

(56) References Cited

U.S. PATENT DOCUMENTS 7,554,624 B2 * 6/2009 Kusuda ............... H04M 1/0283
455/550.1
8,849,362 B1 * 9/2014 Saji ...................... H04B 1/3888
455/575.1
(Continued)

FOREIGN PATENT DOCUMENTS

EP 3396931 2/2017
JP H06-334377 12/1994
(Continued)

OTHER PUBLICATIONS

International Search Report dated May 7, 2020 issued in counterpart application No. PCT/KR2020/001197, 3 pages.

*Primary Examiner* — Lana N Le
(74) *Attorney, Agent, or Firm* — The Farrell Law Firm, P.C.

(57) ABSTRACT

Electronic device including first plate including first flat surface portion facing first direction, wherein first plate forms first surface of electronic device; second plate including second flat surface portion facing second direction opposite first direction, wherein second plate forms second surface of electronic device; side member including first metal part including first metallic material and forming at least part of third surface between first surface and second surface and second metal part including second metallic material, wherein second metal part is bonded with first metal part; and display disposed between first plate and the second plate so as to be shown through the first plate, wherein the first metal part and the second metal part form an interface including the first metallic material and the
(Continued)

second metallic material, and wherein the interface is configured to face a third direction that is perpendicular to the first direction and the second direction.

11 Claims, 16 Drawing Sheets

(51) Int. Cl.
  *H05K 5/04* (2006.01)
  *H05K 5/00* (2006.01)
  *H05K 5/02* (2006.01)
  *H01Q 1/24* (2006.01)

(52) U.S. Cl.
  CPC ............ *H01Q 1/243* (2013.01); *H05K 5/0086* (2013.01); *H05K 5/0247* (2013.01); *H05K 5/04* (2013.01)

(58) Field of Classification Search
  CPC ............. H04M 1/0214; H04M 1/0237; H04M 1/0247; H04M 1/23; H04M 1/724; H04M 1/72403; H04M 1/0283; H04M 1/18; G06F 1/1656; G06F 1/1626; G06F 1/1698; H05K 5/04; H05K 5/0086; H05K 5/0247; H05K 5/00; H05K 7/20; H05K 2201/10969; H05K 7/14; H01Q 1/243; H01Q 1/24; H04B 1/38; H04B 1/3833; H04B 1/385; H04B 1/3888; H04W 88/02; A45C 2011/002
  USPC .................. 455/550.1, 575.1–575.9
  See application file for complete search history.

(56) References Cited

U.S. PATENT DOCUMENTS

| | | | | |
|---|---|---|---|---|
| 9,419,669 B2 * | 8/2016 | Smith | ................ | H04B 1/3888 |
| 9,917,935 B2 * | 3/2018 | Pizzo | ................ | H04B 1/3888 |
| 10,768,664 B2 * | 9/2020 | Cho | ................ | G06F 1/1643 |
| 2004/0023701 A1 * | 2/2004 | Hankui | ................ | H01Q 1/526 455/575.7 |
| 2013/0109435 A1 * | 5/2013 | McGaughey | ............ | H01Q 1/40 455/556.1 |
| 2015/0194995 A1 * | 7/2015 | Fathollahi | ............ | A45C 11/00 455/575.8 |
| 2017/0142239 A1 * | 5/2017 | Bae | ................ | G06F 1/1658 |
| 2017/0201023 A1 * | 7/2017 | Chiu | ................ | H01Q 9/065 |
| 2017/0244171 A1 * | 8/2017 | Lee | ................ | H01Q 5/30 |
| 2018/0033571 A1 * | 2/2018 | Choi | ................ | G06F 1/1671 |
| 2018/0084653 A1 * | 3/2018 | Misra | ................ | G06F 1/163 |
| 2018/0299924 A1 * | 10/2018 | Seo | ................ | G05B 19/18 |
| 2018/0309203 A1 * | 10/2018 | Yu | ................ | H01Q 1/241 |
| 2019/0027812 A1 | 1/2019 | Kim et al. | | |
| 2019/0157746 A1 * | 5/2019 | Ishizuka | ................ | H04M 1/026 |
| 2019/0165454 A1 * | 5/2019 | Lee | ................ | H01Q 21/065 |
| 2019/0222683 A1 | 7/2019 | Choi et al. | | |
| 2019/0339746 A1 * | 11/2019 | Kim | ................ | B32B 7/12 |
| 2020/0037460 A1 * | 1/2020 | Jeong | ................ | C23C 8/30 |
| 2020/0053896 A1 * | 2/2020 | Han | ................ | H04M 1/0266 |
| 2020/0178411 A1 * | 6/2020 | Pham | ................ | H05K 5/061 |
| 2020/0183455 A1 * | 6/2020 | Park | ................ | G06F 1/1626 |
| 2020/0199018 A1 * | 6/2020 | Davis | ................ | G06F 1/1656 |
| 2020/0259243 A1 * | 8/2020 | Jeon | ................ | H01Q 9/0407 |
| 2020/0322467 A1 * | 10/2020 | Huh | ................ | G06F 1/203 |
| 2020/0352038 A1 * | 11/2020 | Kim | ................ | G06F 1/1641 |
| 2020/0358887 A1 * | 11/2020 | Lee | ................ | H04M 1/0235 |
| 2021/0103313 A1 * | 4/2021 | Soh | ................ | G06F 1/1616 |

FOREIGN PATENT DOCUMENTS

| | | | | |
|---|---|---|---|---|
| JP | 2006-093737 | | 4/2006 | |
| KR | 20130119628 A | * | 11/2013 | ......... H04M 1/0266 |
| KR | 1020130119628 | | 11/2013 | |
| KR | 2017-0092794 | | 8/2017 | |
| KR | 10-1889478 | | 8/2018 | |
| KR | 101889478 B1 | * | 8/2018 | ............... H05K 5/02 |
| KR | 2019-0087140 | | 7/2019 | |
| WO | WO-2015134329 A1 | * | 9/2015 | ......... H04M 1/0264 |
| WO | WO-2016112544 A1 | * | 7/2016 | ............... H05K 5/04 |

* cited by examiner

ELECTRONIC DEVICE INCLUDING HOUSING CONTAINING METALLIC MATERIALS

CROSS-REFERENCE TO RELATED APPLICATION(S)

This application is based on and claims priority under 35 U.S.C. § 119 to Korean Patent Application No. 10-2019-0012392, filed on Jan. 31, 2019, in the Korean Intellectual Property Office, the entire disclosure of which is incorporated herein by reference.

BACKGROUND

1. Field

The disclosure relates generally to an electronic device including a housing containing metallic materials.

2. Description of Related Art

The housing of a mobile electronic device is often manufactured by machining a metallic material. In this respect, the housing is generally made of metal, such as aluminum or magnesium, which has high workability. Recently, demands for a housing capable of providing a new appearance are increasing, and a change of the metallic material of the housing is required correspondingly. For example, the housing may contain two or more metallic materials.

The shape of the housing may be formed by pressing a thin metal plate by a press process.

However, a thin metal plate cannot provide sufficient strength to form a structure, such as a rib or a boss, in a housing. Therefore, a housing may further include a separate bracket having an internal structure formed thereon. In this case, a minute gap may be formed between a part forming a surface of a housing and a part forming an internal structure, but such a structure may be disadvantageous to heat dissipation performance. Furthermore, when a part forming a surface of a housing and a part forming an internal structure are made of different metallic materials, heat dissipation performance may be further deteriorated.

SUMMARY

An aspect of the present disclosure is to provide an electronic device including an integrated housing that contains a first metallic material forming an exterior structure and a second metallic material forming an internal structure.

In accordance with an aspect of the present disclosure, an electronic device is provided. The electronic device includes a housing including a front plate, a rear plate, and a side member configured to surround a space between the front plate and the rear plate, wherein the front plate comprises a first flat surface portion configured to face a first direction, and wherein the rear plate comprises a second flat surface portion configured to face a second direction opposite to the first direction; a display disposed in the space between the front plate and the rear plate so as to be shown through the front plate, and a printed circuit board disposed in the space between the front plate and the rear plate and a processor on the printed circuit board, wherein the side member includes an external member including a first metallic material and including a first surface configured to form a surface of the side member and a second surface configured to face a direction toward the space between the front plate and the rear plate, when viewed from above the front plate, an internal member including a second metallic material and including a third surface bonded to the second surface and a fourth surface configured to face the direction toward the space between the front plate and the rear plate, wherein the internal member is surrounded by the external member when viewed from above the front plate, and a polymer member at least partially surrounded by the internal member when viewed from above the front plate, wherein the second surface and the third surface are formed to be substantially flat surfaces, and wherein a longest distance from the first surface to the fourth surface ranges from 0.8 mm to 1.5 mm.

In accordance with another aspect of the present disclosure, an electronic device is provided. The electronic device includes a first plate including a first flat surface portion configured to face a first direction, wherein the first plate is configured to form a first surface of the electronic device, a second plate including a second flat surface portion configured to face a second direction opposite to the first direction, wherein the second plate is configured to form a second surface of the electronic device, a side member including a first metal part including a first metallic material and configured to form at least part of a third surface between the first surface and the second surface and a second metal part including a second metallic material, wherein the second metal part is bonded with the first metal part, and a display disposed between the first plate and the second plate so as to be shown through the first plate, wherein the first metal part and the second metal part form an interface including the first metallic material and the second metallic material, and wherein the interface is configured to face a third direction that is perpendicular to the first direction and the second direction.

In accordance with another aspect of the present disclosure, a method for manufacturing a housing of an electronic device is provided. The method includes preparing a laminated plate by bonding a first metal plate including a first metallic material and a second metal plate including a second metallic material different from the first metallic material, forming part of the housing of the electronic device through a press process or a computer numerical control (CNC) process such that the first metal plate forms a first surface facing outside the housing and the second metal plate forms a second surface facing inside the housing, coating at least part of the second surface with an adhesive material, performing insert-molding on the part of the housing using a polymer resin, and cutting part of the first surface.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Hereinafter, various embodiments of the disclosure are described with reference to the accompanying drawings. However, those of ordinary skill in the art will recognize that modification, equivalent, and/or alternative on the various embodiments described herein may be variously made without departing from the scope and spirit of the disclosure.

Figure 1:
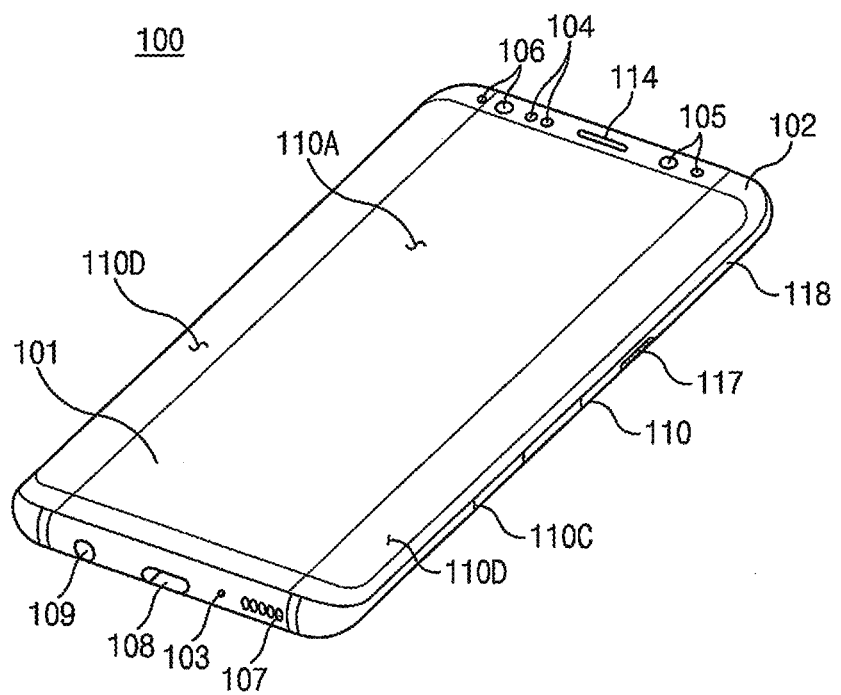
FIG. 1 is a perspective view illustrating a front side of an electronic device, according to an embodiment.
Figure 2:
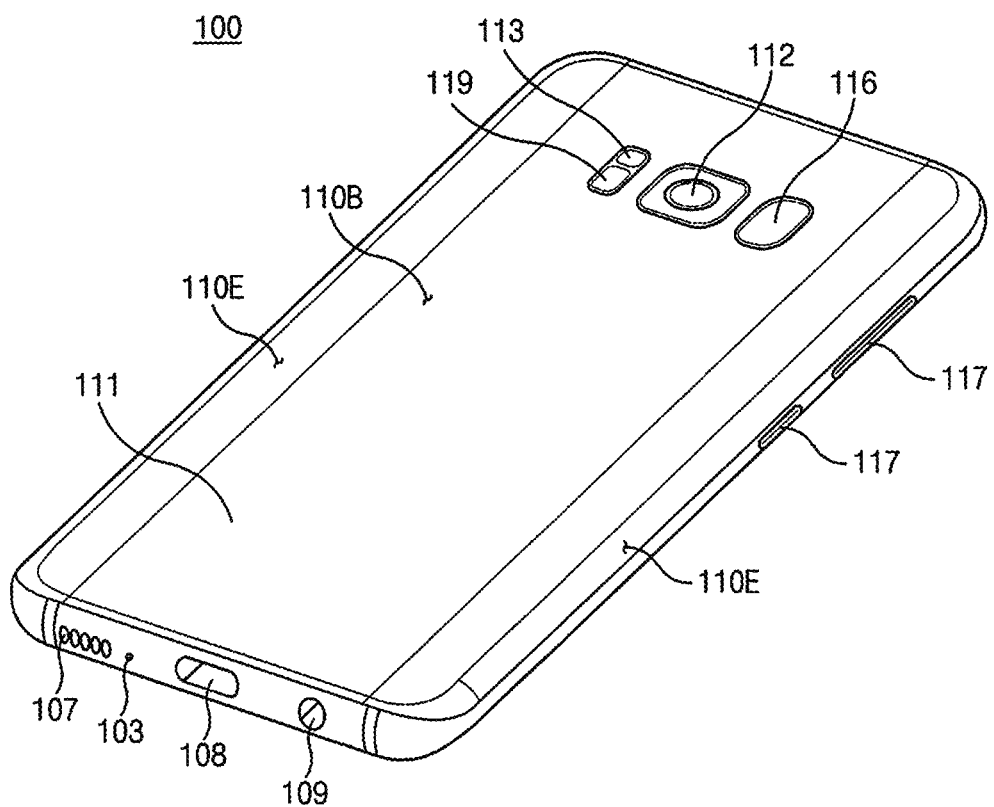
FIG. 2 is a perspective view illustrating a rear side of an electronic device, according to an embodiment.

FIG. 1 is a perspective view illustrating a front side of an electronic device 100, according to an embodiment. FIG. 2 is a perspective view illustrating a rear side of the electronic device 100, according to the embodiment.

Referring to FIGS. 1 and 2, the electronic device 100 may include a housing 110 that includes a first surface (or a front surface) 110A, a second surface (or a rear surface) 110B, and side surfaces 110C that surround a space between the first surface 110A and the second surface 110B. In another embodiment, a housing may refer to a structure that forms some of the first surface 110A, the second surface 110B, and the side surfaces 110C of FIG. 1. The first surface 110A may be formed of a first plate 102, at least a portion of which is substantially transparent (e.g., a glass plate or a polymer plate that includes various coating layers). The second surface 110B may be formed of a second plate 111 that is substantially opaque. The second plate 111 may be formed of, for example, coated or colored glass, ceramic, a polymer, metal (e.g., aluminum, stainless steel (STS), or magnesium), or a combination of at least two thereof. The side surfaces 110C may be formed of a side member (or a side bezel structure) 118 that is combined with the first plate 102 and the second plate 111 and that contains metal and/or a polymer. The first plate 102 and the side member 118 may be integrally formed with each other and may contain the same material (e.g., a metallic material such as aluminum).

The first plate 102 may include, at opposite long edges thereof, two first areas 110D that curvedly and seamlessly extend toward the second plate 111 from the first surface 110A. The second plate 111 may include, at opposite long edges thereof, two second areas 110E that curvedly and seamlessly extend toward the first plate 102 from the second surface 110B. In some embodiments, the first plate 102 (or the second plate 111) may include only one of the first areas 110D (or the second areas 110E). Some of the first areas 110D or the second areas 110E may not be included. When viewed from a side of the electronic device 100, the side member 118 may have a first thickness (or width) at sides not including the first areas 110D or the second areas 110E and may have a second thickness less than the first thickness at sides including the first areas 110D or the second areas 110E.

The electronic device 100 may include at least one or more of a display 101, audio modules 103, 107, and 114, sensor modules 104, 116, and 119, camera modules 105, 112, and 113, key input devices 117, light emitting elements 106, and connector holes 108 and 109. The electronic device 100 may omit at least one component (e.g., the key input devices 117 or the light emitting elements 106) among the aforementioned components, or may additionally include other component(s).

The display 101 may be exposed through a large portion of the first plate 102. At least part of the display 101 may be exposed through the first plate 102 that forms the first surface 110A and the first areas 110D of the side surfaces 110C. The edge of the display 101 may be formed to be substantially the same as the shape of the adjacent periphery of the first plate 102. A gap between the periphery of the display 101 and the periphery of the first plate 102 may be substantially constant to expand the area by which the display 101 is exposed.

Recesses or openings may be formed in a portion of a screen display area of the display 101, and the electronic device 100 includes the audio module 114, the sensor modules 104, the camera modules 105, and the light emitting elements 106 that are aligned with the recesses or the openings. The electronic device 100 may include, on a rear surface of the screen display area of the display 101, at least one or more of the audio module 114, the sensor modules 104, the camera modules 105, the fingerprint sensor 116, and the light emitting elements 106. The display 101 may be combined with, or disposed adjacent to, touch detection circuitry, a pressure sensor for measuring an intensity (pressure) of a touch, and/or a digitizer for detecting a stylus pen of a magnetic type. At least a part of the sensor modules 104 and 119 and/or at least a part of the key input devices 117 may be disposed in the first areas 110D and/or the second areas 110E.

The audio modules 103, 107, and 114 may include the microphone hole 103 and the speaker holes 107 and 114. A microphone for obtaining a sound from the outside may be disposed in the microphone hole 103, and a plurality of microphones may be disposed in the microphone hole 103 to sense the direction of a sound. The speaker holes 107 and 114 may include the external speaker hole 107 and the receiver hole 114 for a telephone call. The speaker holes 107 and 114 and the microphone hole 103 may be implemented with one hole, and a speaker (e.g., a piezoelectric speaker) may be included without the speaker holes 107 and 114.

The sensor modules 104, 116, and 119 may generate an electrical signal or a data value that corresponds to an operational state inside the electronic device 100 or an environmental state outside the electronic device 100. The sensor modules 104, 116, and 119 may include the first sensor module 104 (e.g., a proximity sensor) and/or the second sensor module (e.g., a fingerprint sensor) that is disposed on the first surface 110A of the housing 110, and/or the third sensor module 119 (e.g., a heart rate monitor (HRM) sensor) and/or the fourth sensor module 116 (e.g., a fingerprint sensor) that is disposed on the second surface 110B of the housing 110. The fingerprint sensor may be disposed not only on the first surface 110A of the housing 110 (e.g., the display 101) but also on the second surface 110B. The electronic device 100 may further include a sensor module, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, the illuminance sensor 104, etc.

The camera modules 105, 112, and 113 may include the first camera device 105 disposed on the first surface 110A of the electronic device 100, and the second camera device 112 and/or the flash 113 disposed on the second surface 110B. The camera devices 105 and 112 may include one or more lenses, an image sensor, and/or an image signal processor. The flash 113 may include, for example, a light emitting diode or a xenon lamp. Two or more lenses (an IR camera lens, a wide angle lens, and a telephoto lens) and image sensors may be disposed on one surface of the electronic device 100.

The key input devices 117 may be disposed on the side surfaces 110C of the housing 110. The electronic device 100 may not include all or some of the aforementioned key input devices 117, and the key input devices 117 not included may be implemented in different forms such as soft keys on the display 101. The key input devices 117 may include the sensor module 116 disposed on the second surface 110B of the housing 110.

The light emitting elements 106 may be disposed on the first surface 110A of the housing 110. The light emitting elements 106 may provide, for example, state information of the electronic device 100 in the form of light. The light emitting elements 106 may provide a light source that operates in conjunction with operation of the camera module 105. The light emitting elements 106 may include a light emitting diode (LED), an IR LED, and a xenon lamp.

The connector holes 108 and 109 may include the first connector hole 108 in which a connector (e.g., a universal serial bus (USB) connector) for transmitting and receiving power and/or data with an external electronic device is received, and/or the second connector hole 109 (e.g., an earphone jack) in which a connector for transmitting and receiving audio signals with an external electronic device is received.

Figure 3:
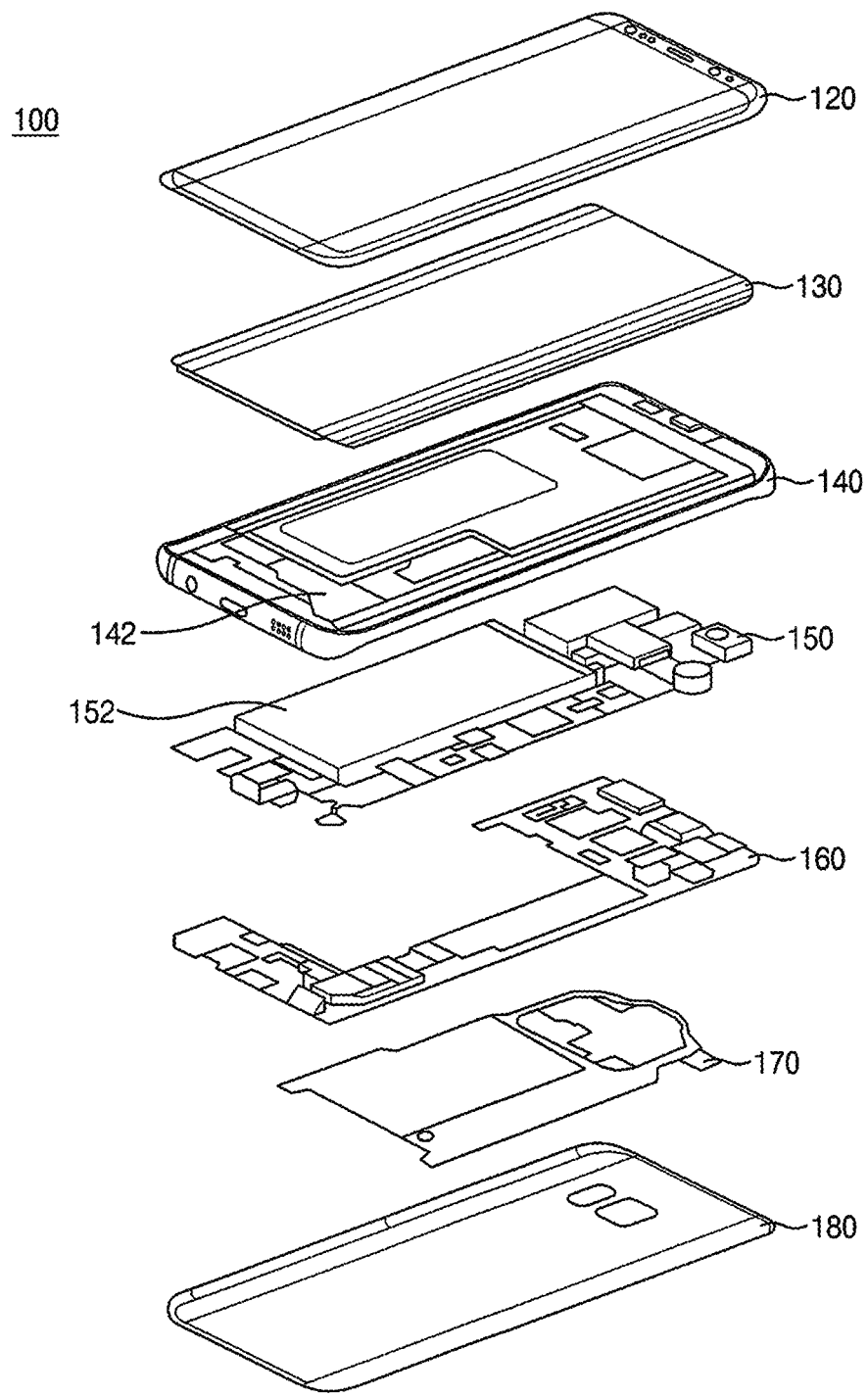
FIG. 3 is an exploded perspective view of an electronic device, according to an embodiment.

FIG. 3 is an exploded perspective view of the electronic device 100, according to an embodiment.

Referring to FIG. 3, the electronic device 100 includes a side member 140, a first support member 142 (e.g., a bracket), a front plate 120, a display 130, a printed circuit board 150, a battery 152, a second support member 160 (e.g., a rear case), an antenna 170, and a rear plate 180. The electronic device 100 may omit at least one component (e.g., the first support member 142 or the second support member 160) among the aforementioned components, or may additionally include other component(s). At least one of the components of the electronic device 100 may be the same as, or similar to, at least one of the components of the electronic device 100 of FIG. 1 or FIG. 2, and repetitive descriptions are omitted here.

The first support member 142 may be disposed in the electronic device 100 and may be connected with the side member 140, or may be integrally formed with the side member 140. The first support member 142 may be formed of a metallic material and/or a nonmetallic material (e.g., a polymer material). The first support member 142 may have one surface to which the display 130 is coupled and an opposite surface to which the printed circuit board 150 is coupled. The printed circuit board 150 may have a processor, a memory, and/or an interface mounted thereon. The processor may include one or more of a central processing unit, an application processor, a graphic processing unit, an image signal processor, a sensor hub processor, or a communication processor.

The memory may include a volatile memory or a non-volatile memory.

The interface may include a high definition multimedia interface (HDMI), a USB interface, a secure digital (SD) card interface, and/or an audio interface. The interface, for example, may electrically or physically connect the electronic device 100 with an external electronic device and may include a USB connector, an SD card/multimedia card (MMC) connector, or an audio connector.

The battery 152 may be a device for supplying power to at least one component of the electronic device 100 and may include a primary cell that is not rechargeable, a secondary cell that is rechargeable, or a fuel cell. At least part of the battery 152 may be disposed on substantially the same plane as the printed circuit board 150. The battery 152 may be integrally disposed in the electronic device 100 and may be disposed so as to be detachable from the electronic device 100.

The antenna 170 may be disposed between the rear plate 180 and the battery 152. The antenna 170 may include a near field communication (NFC) antenna, a wireless charging antenna, and/or a magnetic secure transmission (MST) antenna. The antenna 170 may perform short range communication with an external device, or may wirelessly transmit and receive power required for charging. An antenna structure may be formed by the side member 140 and/or part of the first support member 142, or a combination thereof.

Figure 4A:
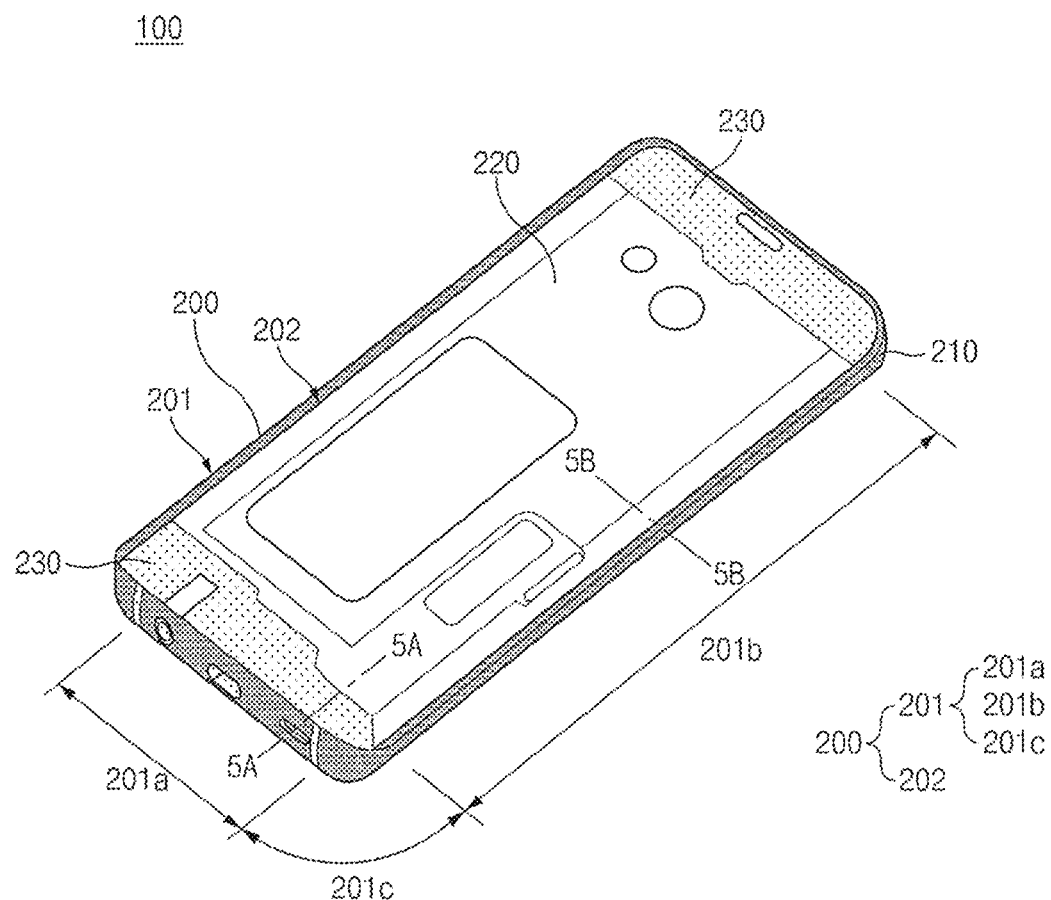
FIGS. 4A and 4B is a view illustrating a side member of an electronic device and a side view from one end of the electronic device, respectively, according to an embodiment.
Figure 4B:
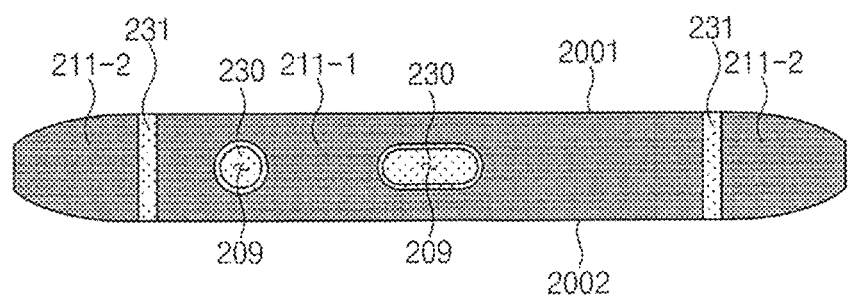

FIGS. 4A and 4B is a view illustrating a side member 200 of the electronic device 100 and a side view from one end of the electronic device 100, respectively, according to an embodiment.

Referring to FIG. 4A, the side member 200 may contain a first metallic material, a second metallic material, or a polymer material.

The side member 200 may include a plate structure 202 and a frame structure 201 that surrounds the periphery of the plate structure 202. The frame structure 201 and the plate structure 202 may be integrally formed with each other, or may be assembled as separate members.

The frame structure 201 may include first parts 201a that extend a first length, second parts 201b that extend a second length longer than the first length, and third parts 201c formed between the first parts 201a and the second parts 201b.

The frame structure 201 may form the side surfaces of the electronic device 100. The plate structure 202 may form a part of an arrangement space in which a printed circuit board (e.g., the printed circuit board 150 of FIG. 3) and a display (e.g., the display 130 of FIG. 3) are arranged.

The side member 200 may include a first metal part 210 containing the first metallic material, a second metal part 220 containing the second metallic material, and a polymer part 230 containing the polymer material.

Figure 5A:
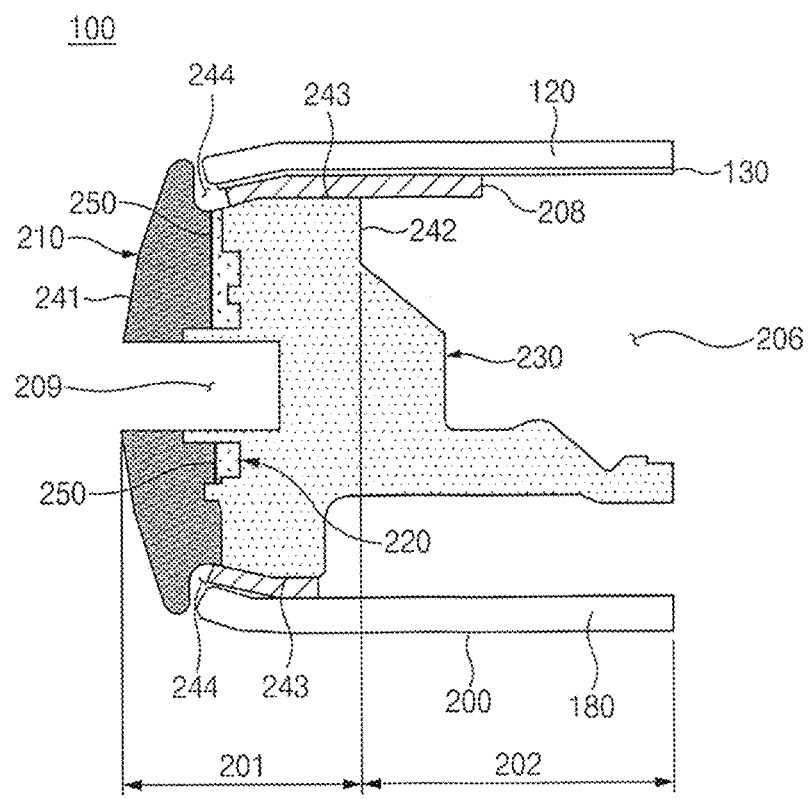
FIGS. 5A and 5B are sectional views of a side member of an electronic device taken along cross-sectional lines 5A-5A and 5B-5B of FIG. 4A, respectively, according to the embodiment.
Figure 5B:
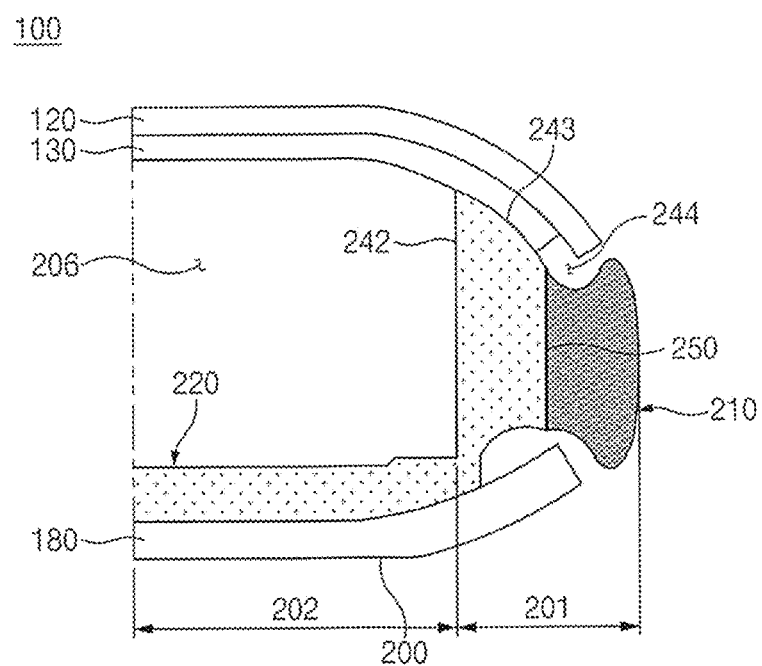

The frame structure 201 may include the first metal part 210 and the polymer part 230. The plate structure 202 may include the second metal part 220 and the polymer part 230. FIGS. 5A and 5B described below in greater detail illustrate sectional views taken along lines 5A-5A and 5B-5B.

Referring to FIG. 4B, the side surfaces of the electronic device 100 that the frame structure 201 forms may include metal area 1-1 211-1 and metal area 1-2 211-2 formed by the first metal part 210 and polymer areas 231 formed by the polymer part 230.

The side member 200 may have holes 209 at least partially formed through the frame structure 201. The polymer part 230 may be formed in the holes 209.

The frame structure 201 may include a first edge 2001 adjacent to a first plate (e.g., the first plate 120 of FIG. 3) and a second edge 2002 adjacent to a second plate (e.g., the second plate 180 of FIG. 3). The polymer areas 231 may extend from the first edge 2001 to the second edge 2002 to segment the first metal part 210 into metal area 1-1 211-1 and metal area 1-2 211-2. Accordingly, metal area 1-1 211-1 and metal area 1-2 211-2 may be electrically insulated from each other.

A metal part (e.g., metal area 1-1 211-1) that is insulated by the polymer areas 231 may form an antenna.

Although FIG. 4A illustrates an example where the polymer areas 231 are formed in the first part 201a of the frame structure 201, the side member 200 disclosed herein or the housing including the side member 200 is not necessarily limited thereto. For example, the polymer areas 231 may be formed in the second part 201b of the frame structure 201, or may be formed in both the first part 201a and the second part 201b.

FIGS. 5A and 5B are sectional views of the side member 200 of the electronic device 100, according to an embodiment. FIGS. 5A and 5B illustrate sectional views taken along lines 5A-5A and 5B-5B illustrated in FIG. 4A, respectively.

Referring to FIGS. 5A and 5B, the electronic device 100 may include the first plate 120 facing a first direction, the second plate 180 facing a second direction opposite to the first direction, and the side member 200 surrounding the interior space between the first plate 120 and the second plate 180.

The side member 200 may include the frame structure 201 and the plate structure 202 that extends from the frame structure 201 to a space 206 between the first plate 120 and the second plate 180 (e.g., the interior space of the housing).

The frame structure 201 of the side member 200 may structurally include an outer surface 241 forming the exterior of the electronic device 100, an inner surface 242 directed toward the interior space, seating areas 243 that are formed between the outer surface 241 and the inner surface 242 and on which waterproof members 208 are seated, and recess areas 244 that are formed between the seating areas 243 and the outer surface 241 and in which the first plate 120 and the second plate 180 are received.

The waterproof members 208 may be disposed between the display 130 and the frame structure 201 and between the second plate 180 and the frame structure 201. However, the electronic device 100 disclosed herein does not necessarily include the waterproof members 208, and the waterproof members 208 may be omitted (e.g., waterproof coating layers may be formed on the frame structure 201). In this case, the second plate 180 or the display 130 may be directly seated on the seating area 230 of the frame structure 201.

The first metallic material contained in the first metal part 210 may include an alloy containing at least one of titanium and stainless steel. The first metallic material may include an amorphous metallic material.

The second metallic material contained in the second metal part 220 may include an alloy containing at least one of aluminum, magnesium, zinc, and copper.

The second metallic material may include a metallic material having higher workability than the first metallic material. The second metallic material may include a metallic material having higher thermal conductivity than the first metallic material. The second metallic material may include a metallic material having higher density than the first metallic material.

The polymer material contained in the polymer part 230 may include at least one of polyether ether ketone (PEEK), polyphenylene sulfide (PPS), polybutylene terephthalate (PBT), polyimide (PI), and polycarbonate (PC).

The first part 201a, shown in FIG. 4A, of the frame structure 201 and the plate structure 202 extend from the first part 201a. The first part 201a of the frame structure 201 of the side member 200 may include the first metal part 210, the second metal part 220, and the polymer part 230.

The hole 209 may be formed in the first part of the frame structure 201 (e.g., the first part 201a of FIG. 4A). The hole 209 may extend toward the interior space 206 of the housing from the outer surface 241, but may not completely pass through the first part 201a. The hole 209 may pass through the part formed of the first metal part 210 and the part formed of the second metal part 220 and may pass through a portion of the part formed of the polymer part 230.

The hole 209 is not limited to being formed in only the first part (e.g., the first part 201a of FIG. 4A) and may be formed in the second part (e.g., the second part 201b of FIG. 4A).

The first metal part 210 may form the outer surface 241 of the frame structure 201 and a portion of each recess area 244. The first metal part 210, together with the second metal part 220, may form the recess areas 244.

The second metal part 220 may be formed between the first metal part 210 and the polymer part 230. The second metal part 220 may form a portion of each recess area 244.

The polymer part 230 may form the inner surface 242 of the frame structure 201 and the plate structure 202 that extends from the inner surface 242 to the space between the first plate 120 and the second plate 180. The polymer part 230 may form the seating areas 243. For example, the polymer part 230 forming the seating areas 243 may absorb impacts applied to the display 130, the first plate 120, or the second plate 180.

The second part 201b of the frame structure 201 of the side member 200 may include the first metal part 210 and the second metal part 220.

The first metal part 210 may form the outer surface 241 of the frame structure 201 and a portion of each recess area 244. The first metal part 210, together with the second metal part 220, may form the recess areas 244.

The second metal part 220 may form a portion of each recess area 244 and the seating areas 243. The second metal part 220 may form the inner surface 242 of the frame structure 201 and the plate structure 202 that extends from the inner surface 242 to the space between the first plate 120 and the second plate 180.

The second part 201b of the frame structure 201 of the side member 200 may further include the polymer part 230 that forms the seating area 243 on which the display 130 or the plate is seated. The polymer part 230 may absorb impacts applied to the display 130, the first plate 120, or the second plate 180.

An interface 250 may be formed between the first metal part 210 and the second metal part 220.

The interface 250 may be formed by bonding the first metal part 210 and the second metal part 220 together. The interface 250 may be formed to be a substantially flat surface. The interface 250 may be formed to be a flat surface that faces a third direction that is substantially perpendicular to the first direction and the second direction.

The interface 250 may be advantageous for the transfer of heat conducted through the first metal part 210 and the second metal part 220 because the interface 250 is formed to be a flat surface. For example, heat generated from the interior of the electronic device 100 may be transferred from the second metal part 220 to the first metal part 210 through the interface 250. The interface 250 may be a compound including the first metal part 210 and the second metal part 220 and may have a lower thermal conductivity than the part formed of only the first metal part 210 and the part formed of only the second metal part 220. Accordingly, the smaller the area of the interface 250, the more advantageous it is for the interface 250 to conduct heat. To this end, the interface 250 may preferably be formed to be a flat surface.

The interface 250 may be formed in various positions between the outer surface 241 and the inner surface 242 of the frame structure 201. The interface 250 may be formed in a position where the interface 250 is capable of providing sufficient bonding force between the first metal part 210 and the second metal part 220, as well as thermal conductivity. For example, the smaller the area of the interface 250, the more advantageous it is for the interface 250 to conduct heat, whereas the bonding force between the metal parts 210 and 220 may be lowered.

When considering only thermal conductivity, an interface having the smallest area may be formed across the recess area 244 in which the first plate 120 is received and the recess area 244 in which the second plate 180 is received. However, the interface having the area may not provide sufficient bonding force between the first metal part 210 and the second metal part 220.

Accordingly, the interface 250 may be formed in an appropriate position in consideration of the area by which the interface 250 is capable of providing sufficient bonding force between the metal parts 210 and 220 and the area by which the interface 250 is capable of providing high thermal conductivity.

The side member 200 may further include an adhesive layer formed between the part formed of the second metal part 220 and the part formed of the polymer part 230. The adhesive layer may prevent moisture from infiltrating the plate structure 202 through the gap between the second metal part 220 and the polymer part 230. The adhesive layer may provide a waterproof function of preventing moisture from infiltrating the plate structure 202 on which a printed circuit board having electronic parts mounted thereon is disposed.

The adhesive layer may include an organic adhesive layer containing at least one of triazine thiol, dithiopyrimidine, or a silane compound.

Figure 6A:
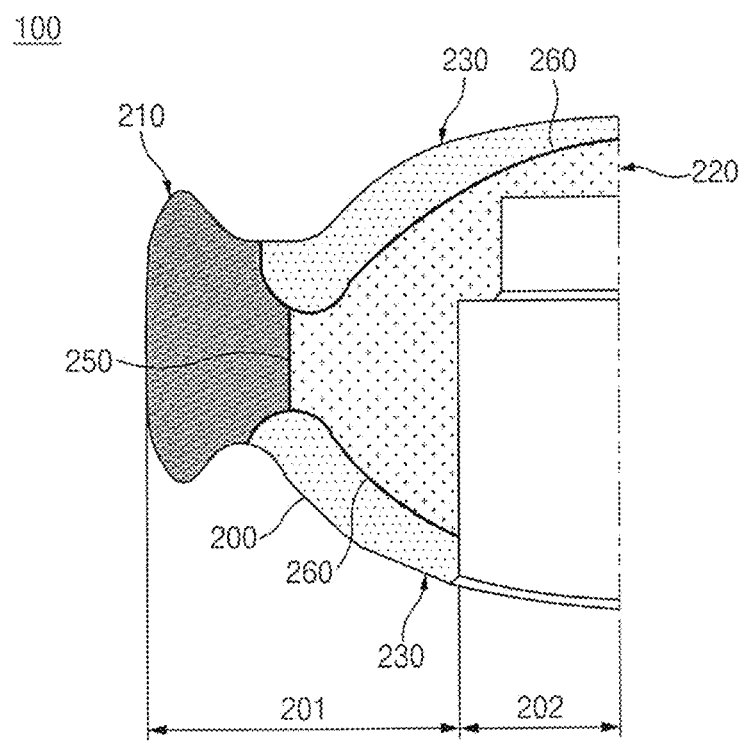
FIGS. 6A and 6B are sectional views of a side member, according to various embodiments.
Figure 6B:
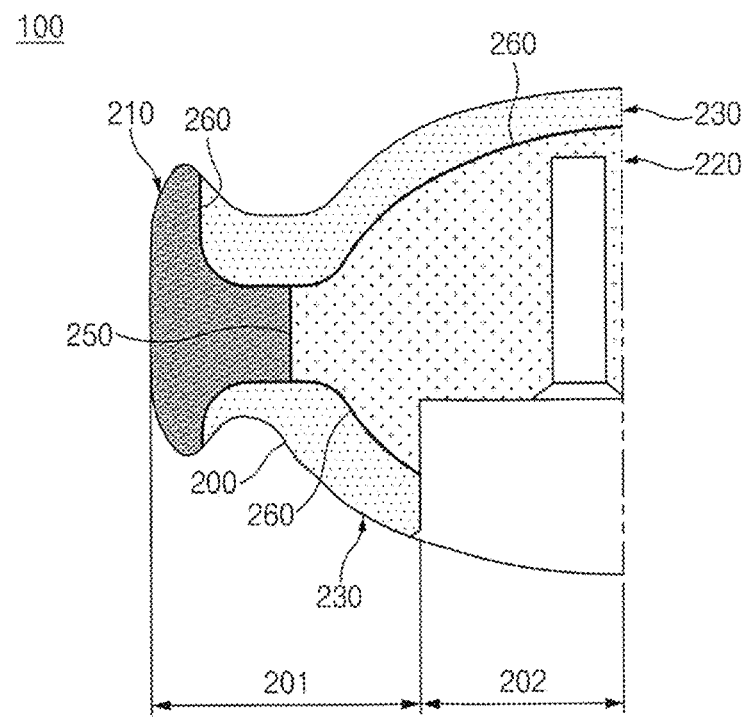

FIGS. 6A and 6B are sectional views of the side member 200 of the electronic device 100, according to various embodiments.

Referring to FIGS. 6A and 6B, the first metal part 210 and the polymer parts 230 may form the exterior of the side member 200. The second metal part 220 may be surrounded by the first metal part 210 and the polymer parts 230. Accordingly, the interface 250 formed by the first metal part 210 and the second metal part 220 may not be exposed outside the side member 200.

The first metal part 210 may form the exterior of the electronic device 100, and the second metal part 220 may be formed in the direction toward the interior of the housing with respect to the first metal part 210. The polymer parts 230 may be formed on the surfaces of the first metal part 210 and the second metal part 220 and may form the exterior of the side member 200 (e.g., the seating areas 243 of FIGS. 5A and 5B).

The side member 200 may further include adhesive layers 260 for preventing foreign matter infiltrating the housing.

The adhesive layers 260 may bond the polymer parts 230 to the second metal part 220.

The adhesive layers 260 may be formed between the second metal part 220 and the polymer parts 230. The adhesive layers 260 may be formed by coating the surfaces of the second metal part 220 with an adhesive material containing at least one of triazine thiol, dithiopyrimidine, or a silane compound. For example, the adhesive layers 260 may contain an organic adhesive material capable of preventing moisture from infiltrating the housing.

The adhesive layers 260 may be formed between the first metal part 210 and the polymer parts 230 and between the second metal part 220 and the polymer parts 230.

The side member 200 may include a waterproof structure for preventing moisture from infiltrating the housing.

The waterproof structure may include the interface 250 that is surrounded by the polymer parts 230 and is not exposed outside the side member 200. Accordingly, moisture may be prevented from infiltrating between the metal parts 210 and 220. The side member 200 includes the frame structure 201 and the plate structure 202.

The waterproof structure may include the adhesive layers 260 formed at the interfaces between the metal parts 210 and 220 and the polymer parts 230.

Figure 7A:
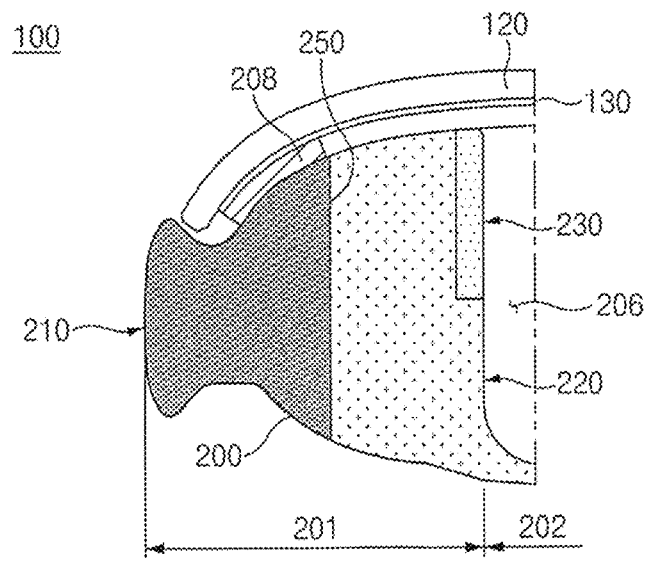
FIGS. 7A and 7B are sectional views of a side member, according to various embodiments.
Figure 7B:
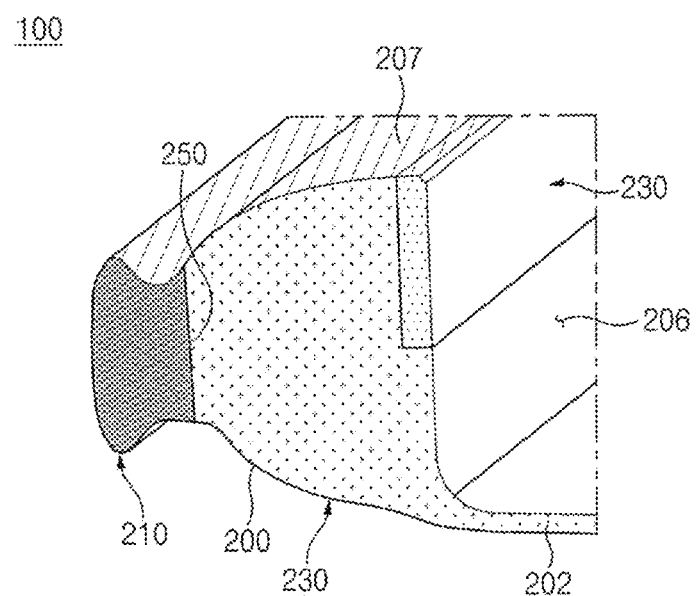

FIGS. 7A and 7B are sectional views of the side member 200 of the electronic device 100, according to various embodiments.

Referring to FIGS. 7A and 7B, the side member 200 may include the first metal part 210, the second metal part 220, and the polymer part 230. The first metal part 210 and the second metal part 220 may form the interface 250.

The waterproof member 208 may be disposed on the side member 200. The waterproof member 208 may be disposed on the surface of the part formed of the first metal part 210. The waterproof member 208 may be disposed outside with respect to the interface 250. That is, the edge formed by the surface of the first metal part 210 and the surface of the second metal part 220 may be formed in a direction toward the interior space 206 of the housing with respect to the waterproof member 208.

The waterproof member 208 may form a waterproof space together with the first plate 120 or the second plate 180, and the interface 250 may be formed in the waterproof space. Accordingly, moisture may be prevented from infiltrating the interface 250.

The waterproof member 208 may be disposed on the surface of the side member 200 to cover the interface 250.

A coating layer 207 may be formed on the surface of the side member 200. The coating layer 207 may be formed by coating the surface of the side member 200 with a coating solution. The coating layer 207 may be formed on the surface of the side member 200 to cover the interface 250.

Accordingly, the coating layer 207 may prevent moisture from infiltrating the interface 250.

The interface 250 formed by the first metal part 210 and the second metal part 220 may be subject to galvanic corrosion when exposed to a corrosion environment in the atmosphere. The first metal part 210 and the second metal part 220 may be corroded due to the corrosion at the interface 250. The corrosion may be exposed outside the electronic device 100 through the first metal part 220. To prevent the galvanic corrosion, the interface 250 may be covered with the polymer part 230 (e.g., FIGS. 6A and 6B), or may be covered with the coating layer 207 (e.g., FIG. 7B). Alternatively, the edge of the interface 250 that is exposed on the surface of the side member 200 may be formed in the waterproof space formed by the waterproof member 208 (e.g., FIG. 7A). The side member 200 includes the display 130, the frame structure 201, and the plate structure 202.

Figure 8A:
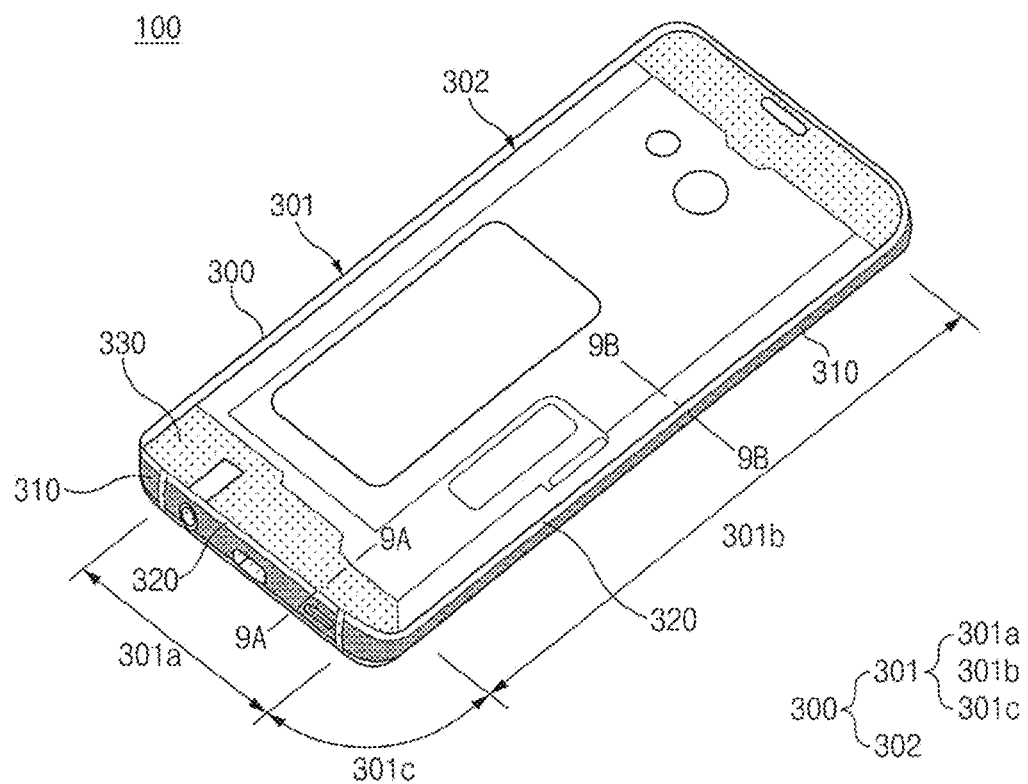
FIGS. 8A and 8B is a view illustrating a side member of an electronic device and a side view from one end of the electronic device, respectively, according to another embodiment.
Figure 8B:
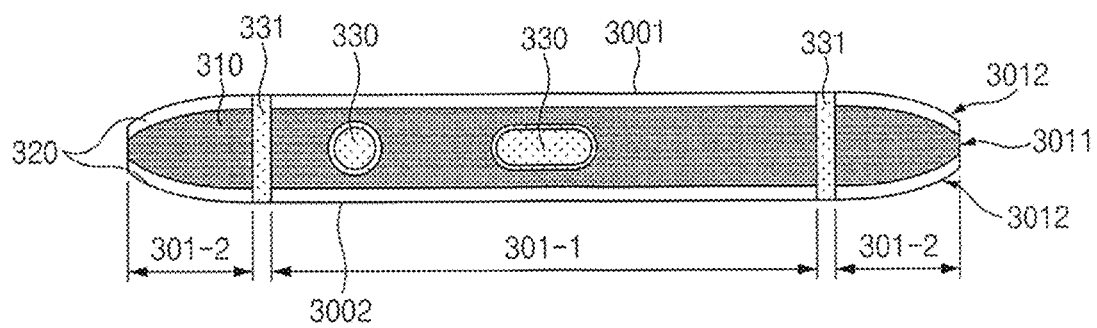

FIGS. 8A and 8B is a view illustrating a side member 300 of the electronic device 100 and a side view from one end of the electronic device 100, respectively, respectively, according to an embodiment.

Referring to FIG. 8A, the side member 300 may contain a first metallic material, a second metallic material, and a polymer material.

The side member 300 may include a plate structure 302 and a frame structure 301 that surrounds the periphery of the plate structure 302. The frame structure 301 and the plate structure 302 may be integrally formed with each other, or may be assembled as separate members.

The frame structure 301 may include first parts 301*a* that extend a first length, second parts 301*b* that extend a second length longer than the first length, and corner parts 301*c* formed between the first parts 301*a* and the second parts 301*b*.

The frame structure 301 may form the side surfaces of the electronic device 100. The plate structure 302 may form a part arrangement space in which a printed circuit board (e.g., the printed circuit board 150 of FIG. 3) and a display (e.g., the display 130 of FIG. 3) are arranged.

The side member 300 may include a first metal part 310 containing the first metallic material, a second metal part 320 containing the second metallic material, and a polymer part 330 containing the polymer material.

Figure 9A:
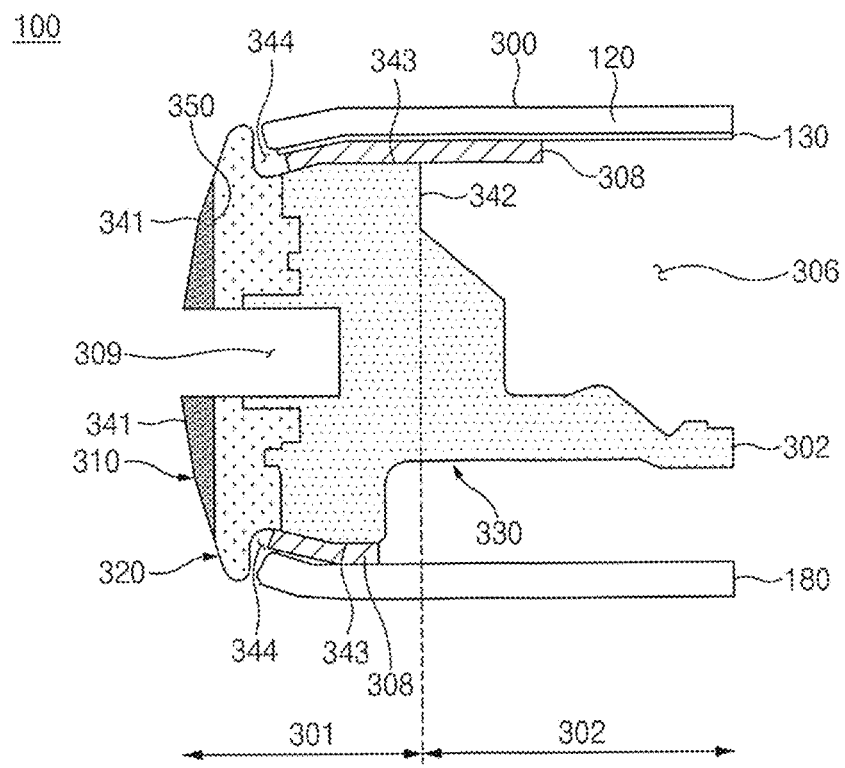
FIGS. 9A and 9B are sectional views of a side member of an electronic device, according to an embodiment.
Figure 9B:
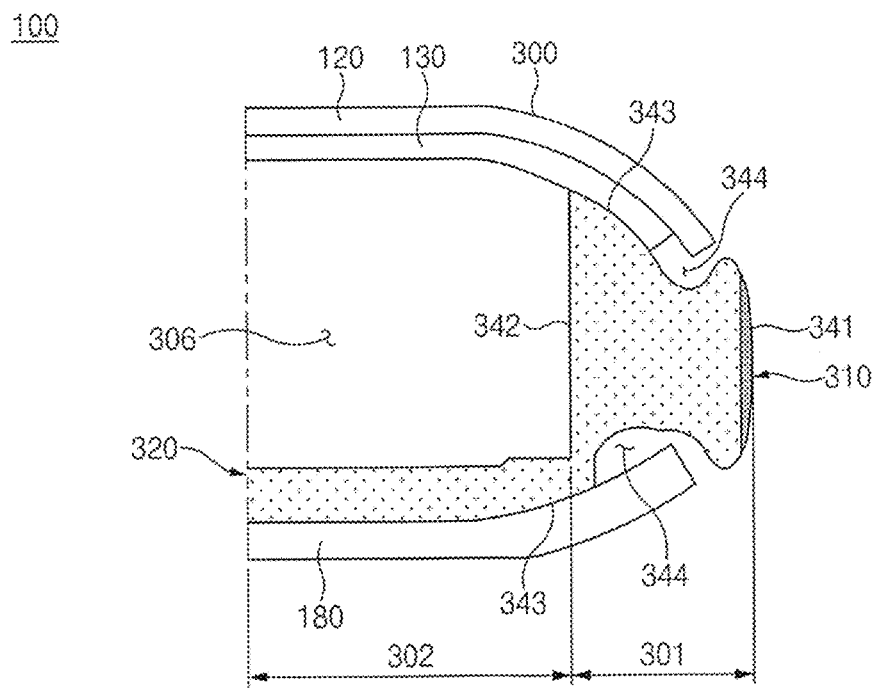

The frame structure 301 may include the first metal part 310, the second metal part 320, and/or the polymer part 330. The plate structure 302 may include the second metal part 320 and/or the polymer part 330. FIGS. 9A and 9B described below in greater detail illustrate sectional views taken along lines 5A-5A and 5B-5B.

Referring to FIG. 8B, the frame structure 301 may include a first edge 3001 adjacent to the first plate (e.g., the first plate 120 of FIG. 3) and a second edge 3002 adjacent to the second plate (e.g., the second plate 180 of FIG. 3).

The sides surfaces of the electronic device 100 that the frame structure 301 forms may include a first area 3011 formed by the first metal part 310, second areas 3012 formed by the second metal part 320, and polymer areas 331 formed by the polymer part 330.

The first area 3011 may be formed between the first edge 3001 and the second edge 3002, and the second areas 3012 may be formed between the first edge 3001 and the first area 3011 and between the second edge 3002 and the first area 3011. That is, part of the periphery of the first area 3011 may be surrounded by the second areas 3012.

The polymer areas 331 may extend from the first edge 3001 to the second edge 3002 and may electrically insulate one portion 301-1 of the frame structure 301 from the other portion 301-2 of the frame structure 301. The one portion 301-1 of the frame structure 301 may form an antenna.

Although FIG. 8A illustrates an example where the polymer areas 331 are formed in the first part 301*a* of the frame structure 301, the side member 300 disclosed herein or the housing including the side member 300 is not necessarily limited thereto. For example, the polymer areas 331 may be formed in the second part 301*b* of the frame structure 301, or may be formed in both the first part 301*a* and the second part 301*b*.

The surface of the side member 300 that forms the outer surface (e.g., the side surfaces) of the electronic device 100 may include areas (e.g., the first area 3011 and the second areas 3012) that at least two metallic materials form, respectively, and therefore the side member 300 may provide various esthetic senses, compared with the side member 200 illustrated in FIG. 5.

Different metallic materials may be formed on the exterior (e.g., the first area 3011 and the second areas 3012) of the side member 300 illustrated in FIG. 8A, and therefore the texture and/or the color may vary.

FIGS. 9A and 9B are sectional views of the side member 300 of the electronic device 100, according to an embodiment. FIGS. 9A and 9B are sectional views taken along lines 9A-9A and 9B-9B illustrated in FIG. 8A, respectively.

Referring to FIGS. 9A and 9B, the electronic device 100 may include the first plate 120 facing the first direction, the second plate 180 facing the second direction, and the side member 300 surrounding the interior space between the first plate 120 and the second plate 180.

The side member 300 may include the frame structure 301 and the plate structure 302 that extends from the frame structure 301 to the space between the first plate 120 and the second plate 180.

The frame structure 301 of the side member 300 may structurally include an outer surface 341 forming the exterior of the electronic device 100, an inner surface 342 directed toward an interior space 306, seating areas 343 that are formed between the outer surface 341 and the inner surface 342 and on which waterproof members 308 are seated, and recess areas 344 that are formed between the seating areas 343 and the outer surface 341 and in which the first plate 120 and the second plate 180 are received.

The waterproof members 308 may be disposed between the display 130 and the frame structure 301 and between the second plate 180 and the frame structure 301.

The side member 300 may contain the first metallic material, the second metallic material, and the polymer material.

The first metallic material contained in the first metal part 310 may include an alloy containing at least one of titanium and stainless steel. The first metallic material may include an amorphous metallic material.

The second metallic material contained in the second metal part 320 may include an alloy containing at least one of aluminum, magnesium, zinc, and copper.

The second metallic material may include a metallic material having higher workability than the first metallic material. The second metallic material may include a metallic material having higher thermal conductivity than the first metallic material. The second metallic material may include a metallic material having higher density than the first metallic material.

The polymer material contained in the polymer part 330 may include at least one of PEEK, PPS, PBT, PI, and PC.

The first part of the frame structure 301 and the plate structure 302. The first part of the frame structure 301 of the side member 300 may include the first metal part 310, the second metal part 320, and the polymer part 330.

A hole 309 may be formed in the first part of the frame structure 301. The hole 309 may extend toward the interior space 306 of the housing from the outer surface 341, but may not completely pass through the first part (e.g., the first part 301a of FIG. 8A).

The hole 309 may pass through the first metal part 310 and the second metal part 320 and may pass through a portion of the polymer part 330.

The hole 309 is not limited to being formed in only the first part (e.g., the first part 301a of FIG. 8A) and may be formed in the second part (e.g., the second part 301b of FIG. 8A).

The first metal part 310 may form a portion of the outer surface 341 of the frame structure 301.

The second metal part 320 may be formed between the first metal part 310 and the polymer part 330. The second metal part 320 may form a portion of the outer surface 341 of the frame structure 301 and the recess areas 344.

The polymer part 330 may form the inner surface 342 of the frame structure 301 and the plate structure 302 that extends from the inner surface 342 to the space between the first plate 120 and the second plate 180. The polymer part 330 may form the seating areas 343. For example, the polymer part 330 forming the seating areas 343 may absorb impacts applied to the display 130, the first plate 120, or the second plate 180.

The second part of the frame structure 301 of the side member 300 may include the first metal part 310 and the second metal part 320.

The second metal part 320, together with the first metal part 310, may form the outer surface 341 of the side member 300. The second metal part 320 may form the recess areas 344 and the seating areas 343. The second metal part 320 may form the inner surface 342 of the frame structure 301 and the plate structure 302 that extends from the inner surface 342 to the space between the first plate 120 and the second plate 180.

The second part of the frame structure 301 may further include the polymer part 330. The polymer part 330 may form a portion of each seating area 344 on which the display 130 or the plate 120 or 180 is seated.

An interface 350 may be formed between the first metal part 310 and the second metal part 320.

The interface 350 may be formed by bonding the first metallic material contained in the first metal part 310 and the second metallic material contained in the second metal part 320. The interface 350 may be formed to be a substantially flat surface. In some embodiments, the interface 350 may be formed to be a flat surface that faces the third direction that is substantially perpendicular to the first direction and the second direction.

The interface 350 may be advantageous for the transfer of heat conducted through the first metal part 310 and the second metal part 320 because the interface 350 is formed to be a flat surface. For example, heat generated from the interior of the electronic device 100 may be transferred from the second metal part 320 to the first metal part 310 through the interface 350. The interface 350 may contain a compound including the first metal part 310 and the second metal part 320 and may have a lower thermal conductivity than the first metal part 310 formed of only the first metallic material and the second metal part 320 formed of only the second metallic material.

Accordingly, the smaller the area of the interface 350, the more advantageous it is for the interface 350 to conduct heat. To this end, the interface 350 may preferably be formed to be a flat surface.

The interface 350 may be formed in various positions between the outer surface 341 and the inner surface 342 of the frame structure 301. The interface 350 may be formed in a position where the interface 350 is capable of providing sufficient bonding force between the first metal part 310 and the second metal part 320, as well as thermal conductivity. For example, the smaller the area of the interface 350, the more advantageous it is for the interface 350 to conduct heat, whereas the bonding force between the metal parts 310 and 320 may be lowered.

When considering only thermal conductivity, an interface having the smallest area may be formed across the recess area 344 in which the first plate 120 is received and the recess area 344 in which the second plate 180 is received. However, the interface having the area may not provide sufficient bonding force between the first metal part 310 and the second metal part 320.

Accordingly, the interface 350 may be formed in an appropriate position in consideration of the area by which the interface 350 is capable of providing sufficient bonding force between the metal parts 310 and 320 and the area by which the interface 350 is capable of providing high thermal conductivity.

The side member 300 may further include an adhesive layer that is formed between the second metal part 320 and the polymer part 330. The adhesive layer may prevent moisture from infiltrating the plate structure 302 through the gap between the second metal part 320 and the polymer part 330. For example, the adhesive layer may provide a waterproof function of preventing moisture from infiltrating the plate structure 302.

The adhesive layer may include an organic adhesive layer containing at least one of triazine thiol, dithiopyrimidine, or a silane compound.

Figure 10:
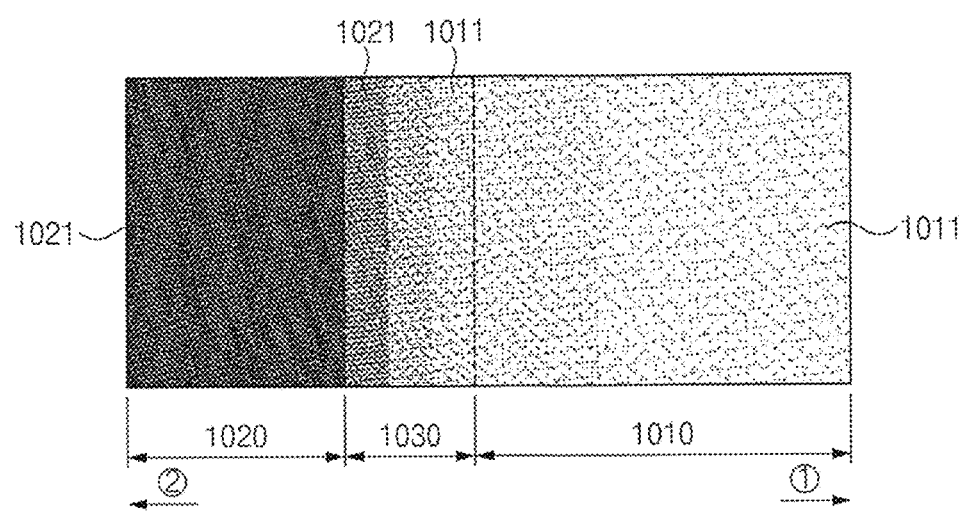
FIG. 10 is an illustration of an interface of a side member of an electronic device, according to an embodiment.

FIG. 10 is an illustration of an interface 1030 of a side member of the electronic device 100, according to an embodiment.

Referring to FIG. 10, the interface 1030 may be formed between a first metal part 1010 and a second metal part 1020. The interface 1030 may contain a first metallic material 1011 contained in the first metal part 1010 and a second metallic material 1021 contained in the second metal part 1020. The interface 1030 may contain a compound consisting of the first metallic material 1011 and the second metallic material 1021.

The interface 1030 may face a third direction (direction ① or ② in FIG. 10) that is substantially perpendicular to a first direction (e.g., the direction that the first plate 120 of FIG. 3 faces, the +Z-axis direction) and a second direction (e.g., the direction that the second plate 180 of FIG. 3 faces, the −Z-axis direction).

The interface 1030 may be formed such that a ratio of the first metallic material 1011 to the second metallic material 1021 substantially increases with an approach to the first metal part 1010 and a ratio of the second metallic material 1021 to the first metallic material 1011 substantially increases with an approach to the second metal part 1020.

The interface 1030 may not contain a separate adhesive material. For example, the interface 1030 may contain a material formed by a physical and/or chemical reaction of the first metallic material 1011 and the second metallic material 1021 at high pressure. The first metal part 1010 and the second metal part 1020 may be completely brought into close contact with each other with no gap therebetween, and, thus, the interface 1030 may be advantageous for heat conduction between the first metal part 1010 and the second metal part 1020.

Figure 11:
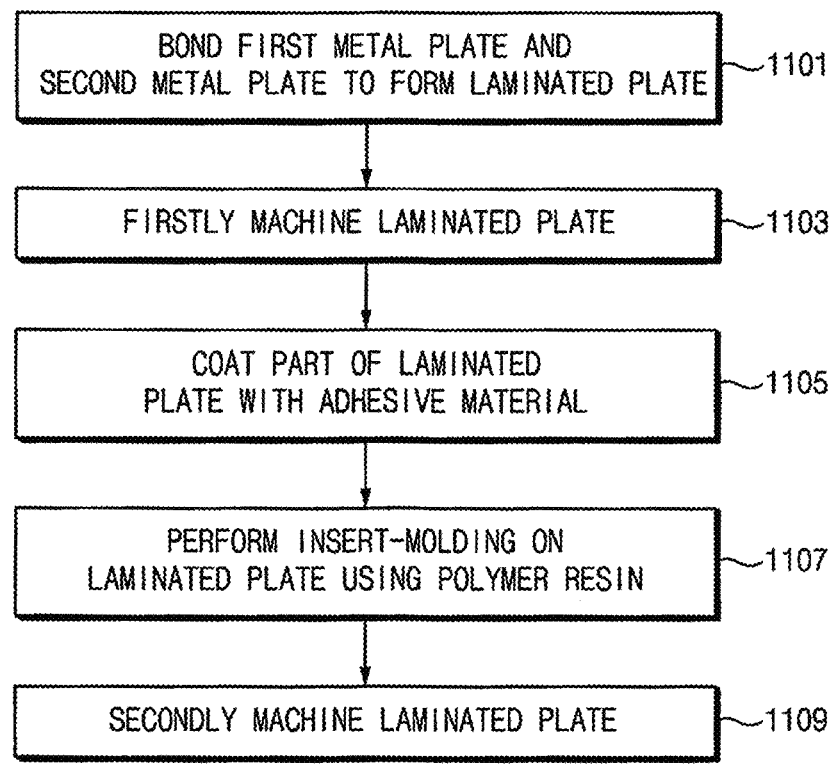
FIG. 11 is a flowchart of a method for manufacturing a housing of an electronic device, according to an embodiment.

FIG. 11 is a flowchart of part of a method for manufacturing a housing of an electronic device (e.g., the side member 200 illustrated in FIGS. 5A and 5B), according to an embodiment.

Referring to FIG. 11, the housing of the electronic device 100 may be manufactured by bonding a first metal plate and a second metal plate to form a laminated plate in step 1101, machining the formed laminated plate a first time in step 1103, coating part of the firstly machined laminated plate with an adhesive material in step 1105, performing insert-molding on the laminated plate, which is partly coated with the adhesive material, by using a polymer resin material in step 1107, and machining the laminated plate subjected to the insert-molding using the polymer resin material a second time in step 1109.

In step 1101 of forming the laminated plate, the first metal plate containing a first metallic material and the second metal plate containing a second metallic material may be bonded together at high pressure. An interface may be formed between the first metal plate and the second metal plate. The interface may contain the first metallic material and the second metallic material. The first metal plate and the second metal plate may be bonded together without a separate structure or a separate adhesive material. Accordingly, air-tightness and heat conduction performance may be improved.

Step 1103 of machining the laminated plate a first time may include a press process of pressing the central portion of the first or second metal plate forming the inner surface of the housing such that one of the first metal plate and the second metal plate forms the outer surface of the housing and the other metal plate forms the inner surface of the housing. The second surface (e.g., the rear plate) and the third surface (e.g., the outer surface of the side member) of the housing may be integrally formed with each other by the press process. The step 1103 of firstly machining the laminated plate may further include a CNC process for forming an internal structure on the laminated plate.

In step 1105 of coating part of the laminated plate with the adhesive material, the adhesive material may be applied to the second metal plate that forms the inner surface of the housing. The adhesive material may form an adhesive layer on the surface of the second metal plate. The adhesive material may contain at least one of triazine thiol, dithiopyrimidine, and a silane compound. The adhesive layer may waterproof the housing. The adhesive material may include a material that has relatively high adhesive force with the second metal plate, but has relatively low adhesive force with the first metal plate. Accordingly, the polymer resin material, which is described below in greater detail, may be mainly bonded to the second metal plate without being bonded to the first metal plate.

The manufacturing method may further include removing the adhesive material, with which the first metal plate is coated, after the laminated plate is coated with the adhesive material.

In step 1107 of performing the insert-molding on the laminated plate using the polymer resin material, the polymer resin material may be formed on the surface of the second metal plate that is coated with the adhesive material. The polymer resin material, which is an insulating material, may electrically insulate part of the first metal plate and the second metal plate from the remaining part to form the antenna area or the antenna part described above.

Step 1109 of machining the laminated plate subjected to the insert-molding using the polymer resin material a second time may include a process of forming the exterior such that the surface of the first metal plate that forms the outer surface of the housing provides an esthetic sense. For example, step 1109 may include a deposition process of depositing another material onto the surface of the first metal plate, a painting process for forming a color on the surface of the first metal plate, or an anodizing process for forming a film layer on the surface of the first metal plate.

Figure 12A:
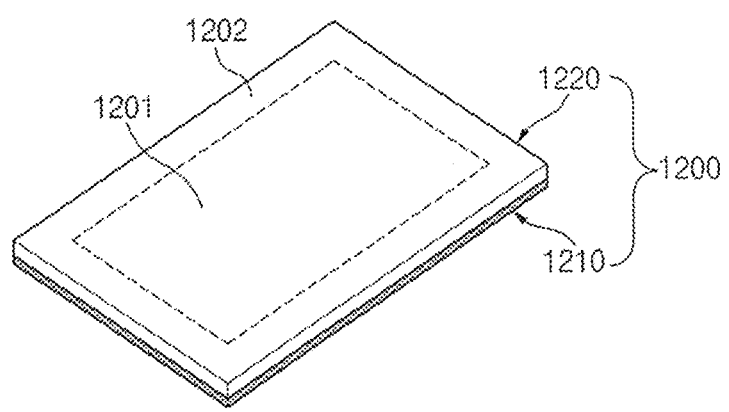
FIGS. 12A and 12B are views illustrating a method for manufacturing a housing of an electronic device, according to various embodiments.
Figure 12B:
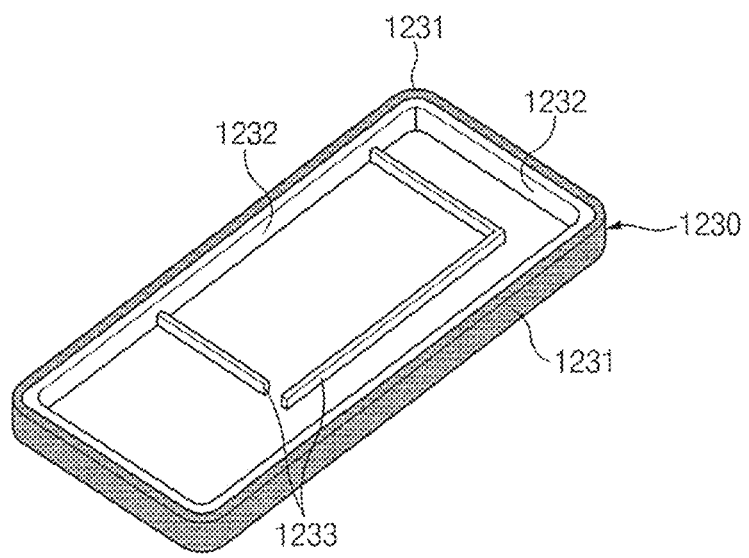

FIGS. 12A and 12B are views illustrating a method for manufacturing a housing 1230 of the electronic device 100, according to various embodiments.

Referring to FIGS. 12A and 12B, a laminated plate 1200 includes a first metal plate 1210 that contains a first metallic material and a second metal plate 1220 that is bonded to the first metal plate 1210 and that contains a second metallic material. The first metal plate 1210 may form an outer surface 1231 of the housing 1230, and the second metal plate 1220 may form an inner surface 1232 of the housing 1230. An interface (e.g., the interface 1030 of FIG. 10) that contains the first metallic material and the second metallic material may be formed between the first metal plate 1210 and the second metal plate 1220. The interface may be formed with no separate adhesive material. The interface may contain a compound consisting of the first metallic material and the second metallic material.

The laminated plate 1200 may have a sufficient thickness to form an internal structure 1233 of the housing 1230. Specifically, the laminated plate 1200 may have a thickness of 1.5 T or more.

The laminated plate 1200 includes a central portion 1201 and an edge portion 1202. The central portion 1201 of the laminated plate 1200 may be pressed by a press process. Accordingly, the central portion 1201 may form a second surface (e.g., the second surface 110B of FIG. 1) of the housing 1230 or a plate structure (e.g., the plate structure 202 of FIG. 4A or the plate structure 302 of FIG. 8A) of a side member (e.g., the side member 200 of FIG. 4A or the side member 300 of FIG. 8A), and the edge portion 1202 may be bent with respect to the central portion 1201 to form a third surface (e.g., the third surface 110C of FIG. 1) of the housing 1230 or a third surface (e.g., the outer surface 241 of FIG. 5A or the outer surface 341 of FIG. 9A) of the side member (e.g., the side member 200 of FIG. 4A or the side member 300 of FIG. 8A).

The internal structure 1233 may be formed on the second metal plate 1220 that forms the inner surface 1232 (e.g., the plate structure 202 of FIG. 4A or 302 of FIG. 8A) of the housing 1230. The internal structure 1233 may be formed by CNC machining.

The internal structure 1233 may be formed on the inner surface 1232 of the housing 1230 according to the illustrated embodiment without a separate bracket (e.g., the support member 142 of FIG. 3), and thus the manufacturing process may be simplified. Furthermore, the housing 1230 may be advantageous in that the first metallic material forms the outer surface 1231 of the housing 1230 to provide an esthetic sense and the second metallic material having higher workability than the first metallic material forms the inner surface 1232 of the housing 1230 and the internal structure 1233 to provide workability.

Figure 13:
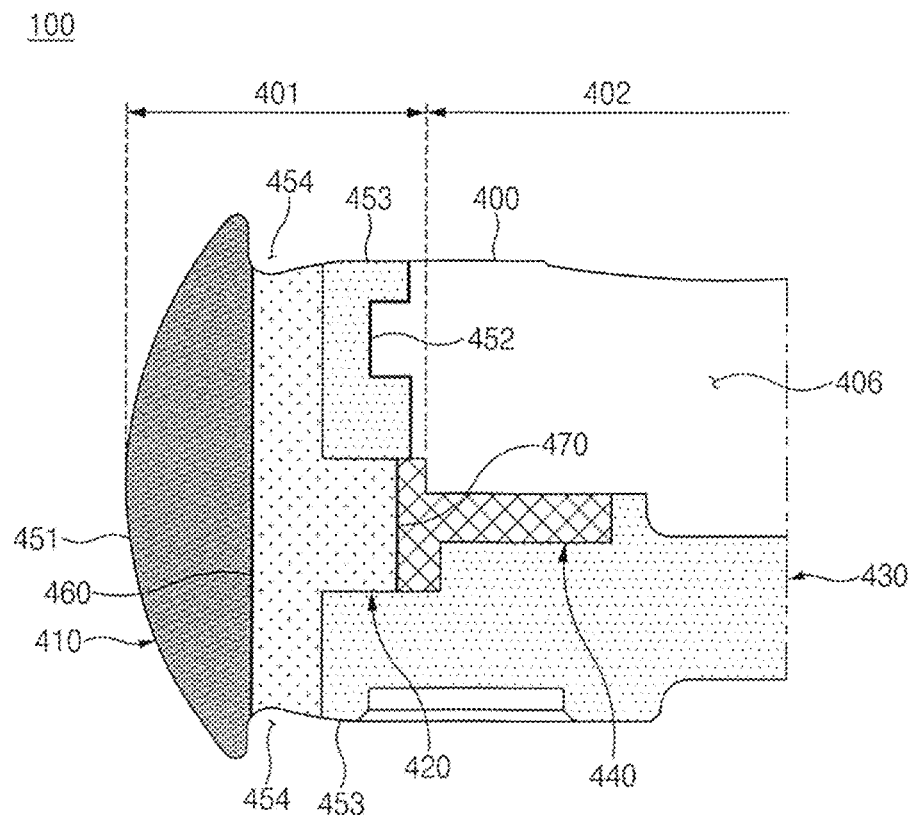
FIG. 13 is a sectional view of a side member of an electronic device, according to an embodiment.

FIG. 13 is a sectional view of a side member 400 of the electronic device 100, according to an embodiment.

Referring to FIG. 13, the side member 400 includes a first metal part 410 containing a first metallic material, a second metal part 420 containing a second metallic material, a third metal part 440 containing a third metallic material, and a polymer part 430 containing a polymer material.

The first metallic material, the second metallic material, and the polymer material may be the same as those described above with reference to FIGS. 4A to 10.

The first metal part 410 may form part of a frame structure 401 that surrounds a plate structure 402 of the side member 400. The first metallic material may form an outer surface 451 that forms the exterior of the electronic device 100.

The second metal part 420 may be formed in a direction toward an interior space 406 of the housing from the surface of the first metal part 410. The second metal part 420, together with the first metal part 410, may form a first interface 460.

The second metal part 420, together with the polymer part 430, may form portions of seating areas 453 on which plates (e.g., the first plate 120 and the second plate 180) or the display 130 is seated. The second metal part 420, together with the first metal part 410, may form recess areas 454.

The first interface 460 may be referred to as the interface illustrated in FIG. 10 (e.g., the interface 1030 of FIG. 10). The first interface 460 may be formed by a physical and chemical bond of the first metal part 410 and the second metal part 420 without a separate adhesive material and may thus form a dense bonding structure. Accordingly, moisture may be prevented from infiltrating the housing.

The polymer part 430 may be formed in the direction toward the interior space 406 of the housing from the surface of the second metal part 420. The polymer part 430 may extend toward the interior of the housing from the second metal part 420. The polymer part 430 may form the plate structure 402 of the side member 400.

The third metal part 440 may be formed in the direction toward the interior space 406 of the housing from the surface of the second metal part 420. At least part of the third metal part 440, together with the polymer part 430, may form the plate structure 402 of the side member 400. The third metal part 440 may be formed to be a ground area of an electrical element provided in the housing. For example, the electrical element may include an antenna.

An adhesive layer may be formed between the polymer parts 430 and the second metal part 420. An adhesive layer may be formed between the polymer part 430 and the third metal part 440. The adhesive layers may provide adhesive forces to attach the polymer part 430 to the surfaces of the second metal part 420 and the third metal part 440. Further, the adhesive layers may prevent foreign matter from infiltrating the housing through the gaps between the polymer part 430, and the second metal part 420 and the third metal part 440. For example, to prevent moisture infiltrating a printed circuit board in the housing, the adhesive layers may include an organic adhesive material containing at least one of triazine thiol, dithiopyrimidine, or a silane compound.

A second interface 470 may be formed between the third metal part 440 and the second metal part 420. Atoms of the third metallic material contained in the third metal part 440 and atoms of the second metallic material contained in the second metal part 420 may be physically mixed to form the second interface 470.

The second metal part 420 may contain a metallic material capable of providing sufficient bonding forces to the first metal part 410 and the third metal part 440. For example, the first metal part 410 and the third metal part 440 may be bonded through the second metal part 420 formed therebetween and may thus be more firmly bonded than when the third metal part 440 is directly bonded to the first metal part 410.

Figure 14:
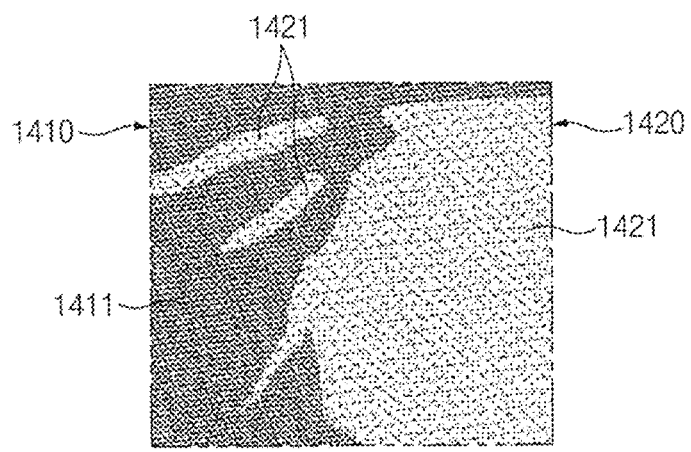
FIG. 14 is an illustration of a second interface, according to an embodiment.

FIG. 14 is an illustration of a second interface 1400, according to an embodiment.

The second interface 1400 may be referred to as the second interface 470 illustrated in FIG. 13.

Referring to FIG. 14, the second interface 1400 may be formed by friction stir welding a third metal part 1420 formed of a third metallic material 1421 (e.g., the third metal part 440 of FIG. 13) to a second metal part 1410 formed of a second metallic material 1411 (e.g., the second metal part 420 of FIG. 13).

For example, the second interface 1400 may be formed by inserting a threaded tool rotating at high speed into the second metal part 1410 to generate frictional heat and forcibly mixing the second metallic material 1411 and the third metallic material 1421 that are softened by the frictional heat.

Comparing the first interface 1030 illustrated in FIG. 10 and the second interface 1400 illustrated in FIG. 14, the boundary between the heterogeneous materials (e.g., the first metallic material 1010 and the second metallic material 1020) at the first interface 1030 may be formed to be a substantially flat surface, whereas the boundary between the heterogeneous materials (e.g., the second metallic material 1411 and the third metallic material 1421) at the second interface 1400 may be substantially non-uniformly formed. The difference may be based on, for example, the second interface 1400 being formed by the friction stir welding using the rotating tool.

The second interface 1400 may have a form in which the third metallic material 1421 infiltrates the second metallic material 1410. In the illustrated embodiment, the second interface 1400 may contain a third metallic material 1421 surrounded by the second metallic material 1411.

Figure 15:
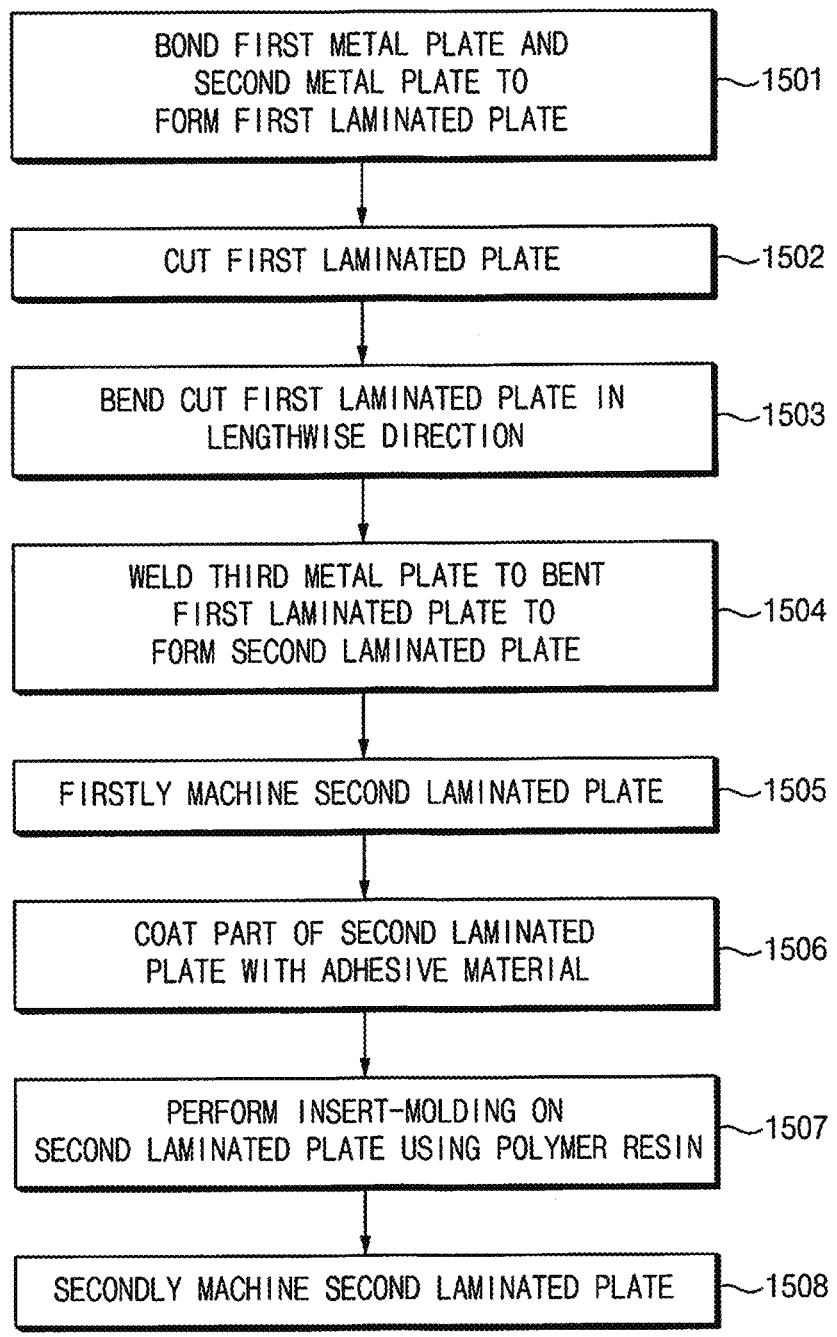
FIG. 15 is a flowchart of a method for manufacturing a housing of an electronic device, according to an embodiment.

FIG. 15 is a flowchart of part of a method for manufacturing a housing of the electronic device 100 (e.g., the side member 400 illustrated in FIG. 13), according to an embodiment.

referring to FIG. 15, a side member (e.g., the side member 400 of FIG. 13) may include a plate structure (e.g., the plate structure 402 of FIG. 13) on which a printed circuit board is disposed and a frame structure (e.g., the frame structure 401 of FIG. 13) that surrounds the plate structure and forms the exterior of the electronic device 100.

The frame structure (e.g., the frame structure 401 of FIG. 13) may be substantially formed by bonding a first metal plate and a second metal plate to form a first laminated plate in step 1501, cutting the formed first laminated plate in step 1502, and bending the cut first laminated plate in the lengthwise direction in step 1503. Thereafter, by welding a third metal plate to the bent first laminated plate in step 1504, as second laminated plate structure (e.g., the plate structure 402 of FIG. 13) may be substantially formed. In step 1505, the second laminated plate is machined a first time. In step 1506, part of the second laminated plate is coated with an adhesive material. In step 1507, insert-molding is performed on the second laminated plate using polymer resin. In step 1508, the second laminated plate is machined a second time.

In step 1501 of forming the first laminated plate, the first metal plate containing a first metallic material (e.g., the first metallic material 410 of FIG. 13) and the second metal plate containing a second metallic material (e.g., the second metallic material 420 of FIG. 13) may be bonded together at high pressure. An interface (e.g., the interface 1030 of FIG.

10) may be formed between the first metal plate and the second metal plate. The interface may contain the first metallic material and the second metallic material. The first metal plate and the second metal plate may be bonded together without a separate structure or a separate adhesive material. Accordingly, air-tightness and heat conduction performance may be improved.

In step 1503 of bending the cut first laminated plate in the lengthwise direction, the cut first laminated plate may be bent such that an opening (e.g., an opening 1623 of FIG. 16 described below) is formed inside and one end portion is connected to an opposite end portion. Then, the second metal plate may be formed to surround the opening, and the first metal plate may be formed to surround the second metal plate. The frame structure of the side member may be formed by the process described above.

In step 1504 of forming the second laminated plate, the third metal plate containing a third metallic material (e.g., the third metallic material 440 of FIG. 13) may be welded to the second metal plate and may be formed in the opening (e.g., the opening 1623 of FIG. 16 described below). For example, the third metal plate may be bonded to the second metal plate by friction stir welding. The plate structure of the side member (e.g., the plate structure 402 of FIG. 13) may be substantially formed by the process described above.

Step 1505 of machining the second laminated plate a first time may include a mechanical machining process such as a CNC process.

In step 1506 of coating the second laminated plate with an adhesive material, the adhesive material may be applied to the surfaces of the second metal plate and the third metal plate. Then, the adhesive material may form adhesive layers on the surfaces of the second metal plate and the third metal plate. The adhesive material may include at least one of triazine thiol, dithiopyrimidine, and a silane compound. The adhesive material may include a material that has relatively high adhesive force with the second metal plate and the third metal plate, but has relatively low adhesive force with the first metal plate. Accordingly, a polymer resin material that will be described below may be mainly bonded to the second metal plate without being bonded to the first metal plate.

The manufacturing method may further include an operation of removing the adhesive material, with which the first metal plate is coated, after step 1506 of coating the second laminated plate with the adhesive material.

In step 1507 of performing insert-molding on the second laminated plate using the polymer resin material, the polymer resin material (e.g., the polymer material of FIG. 13) may be formed on the surfaces of the second metal plate and the third metal plate that are coated with the adhesive material.

Step 1508 of machining the second laminated plate subjected to the insert-molding using the polymer resin material a second time (e.g., the polymer material of FIG. 13) may include a surface treatment process of forming the exterior such that the surface of the first metal plate that forms the outer surface of the housing provides an esthetic sense. For example, step 1508 may include a deposition process of depositing another material onto the surface of the first metal plate, a painting process for forming a color on the surface of the first metal plate, or an anodizing process for forming a film layer on the surface of the first metal plate.

In addition, the operation of machining the second laminated plate subjected to the insert-molding using the polymer resin material a second time may further include a mechanical machining process such as a CNC process, and/or a laser machining process.

Figure 16:
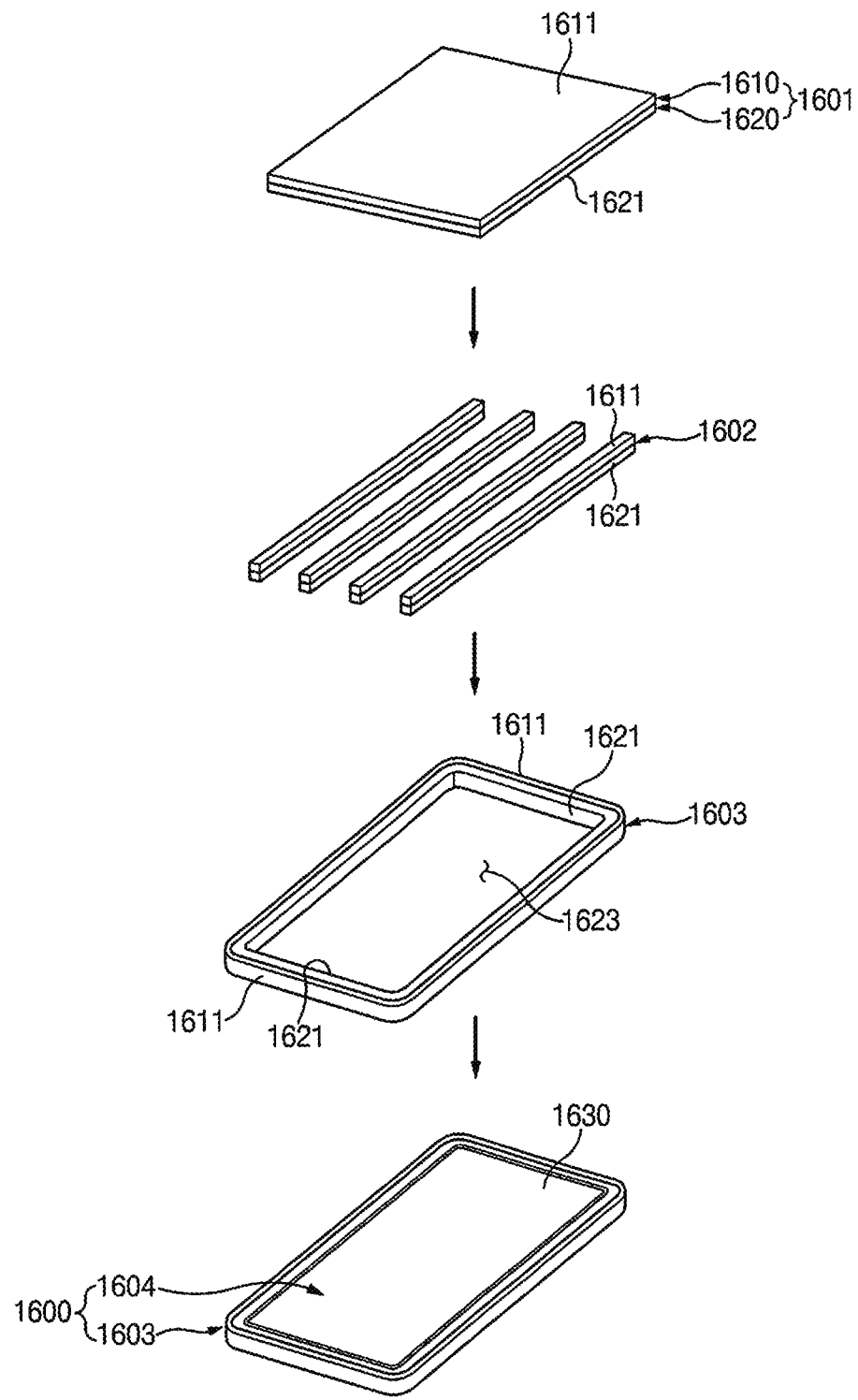
FIG. 16 is an illustration of part of a method for manufacturing a side member of an electronic device, according to an embodiment.

FIG. 16 is an illustration of part of a method for manufacturing a side member 1600 of an electronic device (e.g., the side member 400 illustrated in FIG. 13), according to an embodiment.

Referring to FIG. 16, a laminated plate 1601 includes a first metal plate 1610 that contains a first metallic material 1611 and a second metal plate 1620 that is bonded to the first metal plate 1610 and that contains a second metallic material 1621. An interface (e.g., the interface 1030 of FIG. 10) that contains the first metallic material 1611 and the second metallic material 1621 may be formed between the first metal plate 1610 and the second metal plate 1620.

Laminated members 1602 may each include the first metallic material 1611 and the second metallic material 1621. The laminated members 1602 may be formed by cutting the laminated plate 1601.

The laminated members 1602 may be bent at a predetermined angle to form a frame structure 1603 (e.g., the frame structure 401 of FIG. 13) of the side member 1600 (e.g., the side member 400 of FIG. 13). The frame structure 1603 may be formed by connecting the plurality of laminated members 1602. The frame structure 1603 may be formed by bending the laminated members 1602 such that the opening 1623 is formed inside. The frame structure 1603 may be formed by bending the laminated members 1602 such that the outer surface of the frame structure 1603 is formed of the first metallic material 1611 and the inner surface of the frame structure 1603 is formed of the second metallic material 1621.

The side member 1600 may include the frame structure 1603 (e.g., the frame structure 401 of FIG. 13) and a plate structure 1604 (e.g., the plate structure 402 of FIG. 13) that is surrounded by the frame structure 1603. The plate structure 1604 may be formed by disposing a third metal plate 1630 containing a third metallic material (e.g., the third metallic material of FIG. 13) in the opening 1623. The third metal plate 1630 may be bonded to the frame structure 1603 by friction stir welding the third metallic material to the second metallic material 1621 that forms the inner surface of the frame structure 1603.

In accordance with an embodiment, an electronic device 100 includes a housing 110 including a front plate (e.g., the first plate 120) that includes a first flat surface portion facing a first direction, a rear plate (e.g., the second plate 180) that includes a second flat surface portion facing a second direction opposite to the first direction, and a side member 200 that surrounds a space between the front plate (e.g., the first plate 120) and the rear plate (e.g., the second plate 180), a display 130 disposed in the space so as to be shown through the front plate (e.g., the first plate 120), and a printed circuit board 150 disposed in the space and including a processor. The side member 200 may include an external member (e.g., the first metal part 210) that contains a first metallic material and includes a first surface forming a surface of the side member 200 and a second surface facing a direction toward the space, when viewed from above the front plate (e.g., the first plate 120), an internal member (e.g., the second metal part 220) that contains a second metallic material and includes a third surface bonded to the second surface and a fourth surface facing the direction toward the space, the internal member (e.g., the second metal part 220) being surrounded by the external member (e.g., the first metal part 210) when viewed from above the front plate (e.g., the first plate 120), and a polymer member (e.g., the polymer part 230) that contains a polymer material and that is at least partially surrounded by the internal member (e.g., the second metal part 220) when viewed from above the front plate (e.g., the first plate 120). The second surface and the third surface may be formed to be flat surfaces facing a third direction that is substantially perpendicular to the first direction and the second direction, and the internal member (e.g., the second metal part 220) and the external member (e.g., the first metal part 210) may be formed such that the thickness from the first surface to the fourth surface in the third direction is 1.5 mm or less.

The first metallic material may include stainless steel, and the second metallic material may include aluminum or aluminum alloy.

The electronic device may further include an adhesive layer formed between the internal member (e.g., the second metal part 220) and the polymer member (e.g., the polymer part 230).

The electronic device may further include an interface 850 including the second surface and the third surface, and the interface 850 may contain a compound consisting of the first metallic material and the second metallic material.

The interface 850 may be formed such that a ratio of the first metallic material to the second metallic material increases with an approach to the second surface and a ratio of the second metallic material to the first metallic material increases with an approach to the third surface.

The interface 850 may have a thickness of 1 μm or less in a third direction.

The internal member (e.g., the second metal part 220) may further include an extension (e.g., a plate part 204) that extends into the space from the fourth surface, and the display 130 and the printed circuit board 150 may be disposed on the extension (e.g., the plate part 204).

The external member (e.g., the first metal part 210) and the internal member (e.g., the second metal part 220) may include a first part 210a and second parts 210b and 210c formed on opposite sides of the first part 210a, and the polymer member (e.g., the polymer part 230) may extend between the first part 210a and the second parts 210b and 210c such that the first part 210a is electrically insulated from the second parts 210b and 210c.

A conductive pattern is formed on the fourth surface of the internal member (e.g., the second metal part 220) that is included in the first part 210a, and the first part 210a may include an antenna.

An electronic device 100 may include a first plate 120 that includes a first flat surface portion 121 facing a first direction and forms a first surface of the electronic device 100, a second plate 180 that includes a second flat surface portion 181 facing a second direction opposite to the first direction and forms a second surface of the electronic device 100, a side member 200 including a first metal part that contains a first metallic material and forms at least part of a third surface between the first surface and the second surface and a second metal part 220 that contains a second metallic material and that is bonded with the first metal part 210, and a display 130 disposed between the first plate 120 and the second plate 180 so as to be shown through the first plate 120. The first metal part 210 and the second metal part 220 may form an interface 850 that contains the first metallic material and the second metallic material and that faces a third direction that is perpendicular to the first direction and the second direction.

The interface 850 may have a maximum thickness of 1 μm or less that is measured along the third direction.

The first metal part 210 may include an outer surface 241 that is opposite the interface 850 and that forms the third surface of the electronic device 100, the second metal part 220 may include an inner surface 242 that is opposite the interface 850 and that faces a space between the first plate 120 and the second plate 180, and the side member 200 may have a maximum thickness of 0.8 mm to 1.5 mm that is measured along the third direction from the inner surface 242 to the outer surface 241.

The second metal part 220 may further include an extension (e.g., the plate part 204) that extends from the inner surface 242 toward the space between the first plate 120 and the second plate 180 and on which the display 130 is disposed, and the electronic device 100 may further include a printed circuit board 150 disposed on the extension (e.g., the plate part 204).

The first metal part 210 may contain stainless steel, and the second metal part 220 may contain aluminum.

The first plate 120 may include a first curved surface portion that surrounds an edge of the first flat surface portion 121, and the second plate 180 may include a second curved surface portion that surrounds an edge of the second flat surface portion 181. The side member 200 may include first recesses 2451 and 2453 in which the first curved surface portion of the first plate 120 is received and second recesses 2452 and 2454 in which the second curved surface portion of the second plate 180 is received, and the first recesses 2451 and 2453 and the second recesses 2452 and 2454 are formed by the second metal part 220.

The first metal part 210 and the second metal part 220 may form a first part 210a and second parts 210b and 210c spaced apart from the first part 210a. The side member 200 may further include a polymer part 230 containing a polymer material. The polymer part 230 may be formed between the first part 210a and the second parts 210b and 210c to electrically insulate the first part 210a from the second parts 210b and 210c. The first part 210a may form an antenna.

The second plate 180 may extend from the side member 200 and may be integrally formed with the side member 200, and the second plate 180 may contain the first metallic material forming the second surface of the electronic device 100 and the second metallic material forming an inner surface 242 facing the first plate 120.

A method for manufacturing a housing of an electronic device 100 may include step 901 of preparing a laminated plate 1000 by bonding a first metal plate 1010 containing a first metallic material and a second metal plate 1020 containing a second metallic material different from the first metallic material; step 903 of pressing the laminated plate 1000 such that the first metal plate 1010 forms an outer surface 1110 of the housing and the second metal plate 1020 forms an inner surface 1120 of the housing; step 905 of coating at least part of the second metal plate 1020 with an adhesive material; step 907 of performing insert-molding on the laminated plate 1000 using a polymer material; and step 909 of cutting part of the outer surface 1110 and part of the inner surface 1120.

Step 903 of pressing the laminated plate 1000 may include an operation of pressing a central portion 1001 of the laminated plate 1000 such that an edge portion 1002 of the laminated plate 1000 and the central portion 1001 of the laminated plate 1000 form surfaces of the housing facing different directions.

The method may further include forming a film layer on the outer surface 1110 of the housing after step 909 of cutting the part of the outer surface 1110 and the part of the inner surface 1120.

An electronic device according to an embodiment may include a housing that contains a first metallic material forming an exterior and a second metallic material forming an internal structure and that includes a bonding structure capable of providing high thermal conductivity between the first metallic material and the second metallic material.

In addition, the disclosure may provide various effects that are directly or indirectly recognized.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related components. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if a component (e.g., a first component) is referred to, with or without the term "operatively" or "communicatively", as "coupled with," "coupled to," "connected with," or "connected to" another component (e.g., a second component), it means that the component may be coupled with the other component directly (e.g., wiredly), wirelessly, or via a third component.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may mean that the device is "capable of" operating together with another device or other components. For example, a "processor configured to (or set to) perform A, B, and C" may mean a dedicated processor (e.g., an embedded processor) for performing corresponding operations or a generic-purpose processor (e.g., a central processing unit (CPU) or an application processor) which performs corresponding operations by executing one or more software programs which are stored in a memory device (e.g., the memory 130).

The term "module" used herein may include a unit, which is implemented with hardware, software, or firmware, and may be interchangeably used with the term "logic", "logical block", "component", "circuit", or the like. The "module" may be a minimum unit of an integrated component or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

According to various embodiments, at least a part of an apparatus (e.g., modules or functions thereof) or a method (e.g., operations) may be, for example, implemented by instructions stored in a computer-readable storage media (e.g., the memory 130) in the form of a program module. The instruction, when executed by a processor (e.g., a processor 120), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device, comprising:
  a housing including a front plate, a rear plate, and a side member configured to surround a space between the front plate and the rear plate, wherein the front plate comprises a first flat surface portion configured to face a first direction, and wherein the rear plate comprises a second flat surface portion configured to face a second direction opposite to the first direction;
  a display disposed in the space between the front plate and the rear plate so as to be shown through the front plate; and
  a printed circuit board disposed in the space between the front plate and the rear plate and a processor on the printed circuit board,
  wherein the side member comprises:
  an external member comprising a first metallic material and comprising a first surface configured to form a surface of the side member and a second surface configured to face a direction toward the space between the front plate and the rear plate, when viewed from above the front plate;
  an internal member comprising a second metallic material and comprising a third surface bonded to the second surface and a fourth surface configured to face the direction toward the space between the front plate and the rear plate, wherein the internal member is surrounded by the external member when viewed from above the front plate; and
  a polymer member at least partially surrounded by the internal member when viewed from above the front plate,
  wherein the second surface and the third surface form an interface layer comprising the first metallic material and the second metallic material, and are formed to be substantially flat surfaces, and wherein a longest distance from the first surface to the fourth surface ranges from 0.8 mm to 1.5 mm.

2. The electronic device of claim 1, wherein the first metallic material comprises stainless steel, and wherein the second metallic material comprises aluminum or an aluminum alloy.

3. The electronic device of claim 1, further comprising an adhesive layer formed between the internal member and the polymer member.

4. The electronic device of claim 1, wherein the interface layer comprises a compound comprising the first metallic material and the second metallic material.

5. The electronic device of claim 4, wherein the interface layer is formed such that a ratio of the first metallic material to the second metallic material increases with an approach to the second surface and a ratio of the second metallic material to the first metallic material increases with an approach to the third surface.

6. The electronic device of claim 4, wherein the interface layer has a thickness of 1 μm or less in a third direction.

7. The electronic device of claim 1, wherein the internal member further comprises an extension extending into the space between the front plate and the rear plate from the fourth surface, and wherein the display and the printed circuit board are disposed on the extension.

8. The electronic device of claim 1, wherein the external member and the internal member comprise a first part, a second part formed on one side of the first part, and a third part formed on an opposite side of the first part, and wherein the polymer member extends between the first part and the second part and between the first part and the third part such that the first part is electrically insulated from the second part and the third part.

9. The electronic device of claim 8, wherein a conductive pattern is formed on the fourth surface of the internal member that comprises the first part, and wherein the first part comprises an antenna.

10. The electronic device of claim 1, wherein the front plate comprises a first curved surface portion configured to surround an edge of the first flat surface portion, wherein the rear plate comprises a second curved surface portion configured to surround an edge of the second flat surface portion, wherein the side member comprises a first recess in which the first curved surface portion of the front plate is received and a second recess in which the second curved surface portion of the rear plate is received, and wherein the first recess and the second recess are formed by a second metal part.

11. The electronic device of claim 1, wherein the rear plate extends from the side member and is integrally formed with the side member, and wherein the rear plate comprises the first metallic material forming the second surface of the electronic device and the second metallic material forming an inner surface facing the front plate.

* * * * *